United States Patent
Sakata et al.

(10) Patent No.: US 8,730,112 B2
(45) Date of Patent: *May 20, 2014

(54) ANTENNA EVALUATION APPARATUS AND ANTENNA EVALUATION METHOD FOR CREATING MULTIPATH WAVES AROUND RECEIVING ANTENNA

(75) Inventors: Tsutomu Sakata, Osaka (JP); Atsushi Yamamoto, Kyoto (JP); Satoru Amari, Osaka (JP)

(73) Assignee: Panasonic Corporation, Osaka (JP)

( * ) Notice: Subject to any disclaimer, the term of this patent is extended or adjusted under 35 U.S.C. 154(b) by 576 days.

This patent is subject to a terminal disclaimer.

(21) Appl. No.: 13/056,490

(22) PCT Filed: Apr. 21, 2010

(86) PCT No.: PCT/JP2010/002882

§ 371 (c)(1),
(2), (4) Date: Jan. 28, 2011

(87) PCT Pub. No.: WO2010/131423

PCT Pub. Date: Nov. 18, 2010

(65) Prior Publication Data

US 2011/0128197 A1   Jun. 2, 2011

(30) Foreign Application Priority Data

May 12, 2009 (JP) ................................. 2009-115486
Oct. 19, 2009 (JP) ................................. 2009-240556

(51) Int. Cl.
*G01R 29/10* (2006.01)
(52) U.S. Cl.
USPC ........................................................ 343/703

(58) Field of Classification Search
USPC ........................................................ 343/703
See application file for complete search history.

(56) References Cited

U.S. PATENT DOCUMENTS

| 5,355,519 A * | 10/1994 | Hasegawa | 455/506 |
| 2003/0050020 A1 * | 3/2003 | Erceg et al. | 455/101 |

FOREIGN PATENT DOCUMENTS

| JP | 11-266212 | 9/1999 | |
| JP | 2000-209166 | 7/2000 | |
| JP | 2000-324063 | 11/2000 | |
| JP | 2005-227213 | 8/2005 | |
| JP | 3816499 | 6/2006 | |
| JP | 2009-49966 | 3/2009 | |
| JP | 2009049966 A * | 3/2009 | H04J 99/00 |

OTHER PUBLICATIONS

International Preliminary Report on Patentability issued Dec. 22, 2011 in International (PCT) Application No. PCT/JP2010/002882.

(Continued)

*Primary Examiner* — Dameon Levi
*Assistant Examiner* — Collin Dawkins
(74) *Attorney, Agent, or Firm* — Wenderoth, Lind & Ponack, L.L.P.

(57) ABSTRACT

An antenna evaluation apparatus includes receiving antennas to be evaluated, scatterer antennas provided around them, signal generators, delay circuits, dividers, phase-shift circuits, and attenuation circuits. A computer controls the delay circuits to add delay times to radio frequency signals, and controls the phase-shift circuits and attenuation circuits to change phases and amplitudes of the radio frequency signals to produce a first fading. The antenna evaluation apparatus radiates the radio frequency signals from the scatterer antennas, thus creating multipath waves including delay and fading around the receiving antenna.

14 Claims, 31 Drawing Sheets

(56) References Cited

OTHER PUBLICATIONS

International Search Report issued Aug. 3, 2010 in International (PCT) Application No. PCT/JP2010/002882.

Yoshio Karasawa, "Radiowave Propagation Fundamentals for Digital Mobile Communications", Corona Publishing Co., Ltd., pp. 5-8, Mar. 2003 (along with partial English translation).

Tsutomu Sakata et al., "Evaluation of Mobile Terminal Antennas using Spatial Fading Emulator", Matsushita Technical Journal, vol. 52, No. 5, pp. 70-75, Oct. 2006 (along with English abstract).

Tsutomu Sakata et al., "Channel Capacity Measurements of a MIMO Antenna under a Rayleigh-fading Channel by a Spatial Fading Emulator", Proceedings of the 2007 IEICE Society Conference, B-1-9, Sep. 2007 (along with partial English translation).

Tsutomu Sakata et al., "A Multipath Measurement System with a Variable Power Angular Spectrum for Handset MIMO Antennas", IEICE Technical Report, vol. 108, No. 5, pp. 13-18, Apr. 2008 (along with English abstract).

Tsutomu Sakata et al., "An Evaluation of the MIMO Transmission Characteristics in a Cluster Propagation Environment Using a Spatial Fading Emulator", IEICE Technical Report, vol. 108, No. 429, pp. 121-126, Apr. 2009 (along with English abstract).

\* cited by examiner

ANTENNA EVALUATION APPARATUS AND ANTENNA EVALUATION METHOD FOR CREATING MULTIPATH WAVES AROUND RECEIVING ANTENNA

TECHNICAL FIELD

The present invention relates to an antenna evaluation apparatus for evaluating the performance of an antenna of a wireless communication apparatus, and relates to an antenna evaluation method using the same antenna evaluation apparatus.

BACKGROUND ART

In recent years, wireless terminal apparatuses for mobile communication such as mobile phones have been rapidly developed. When a radio wave arrives at a wireless terminal apparatus from a base station, the radio wave includes multipath waves produced from reflection, scattering, diffraction, or the like due to terrain, structures, and the like in its propagation path, and the radio wave has randomly changing amplitude and phase depending on the location. When receiving a radio wave from the base station as well as moving within its propagation path, fading (i.e., signal level drops, including variation in instantaneous values) occurs due to multipath propagation of the radio wave. As a result, a digital communication environment suffers from increased errors in codes and significant degradation of transmission quality (see Non-Patent Literature 1). Thus, if evaluating the communication performance of a wireless terminal apparatus, it is desirable not only to evaluate its static characteristics in an RF anechoic chamber, but also to evaluate its performance in a multipath propagation environment. Hence, the applicant of the present application proposed antenna evaluation apparatuses (also referred to as "spatial multipath waves generating apparatuses" or "fading emulators") such as those described in Patent Literature 1 and Non-Patent Literatures 2 to 5.

FIG. 32 is a block diagram showing a configuration of a prior art antenna evaluation apparatus described in Patent Literature 1. The antenna evaluation apparatus includes: a plurality of transmitting antennas (referred to as "scatterer antennas" hereinafter) 121-1 to 121-7 disposed at regular intervals on the circumference of a circle with a radius r; an antenna under measurement 122 disposed near a center of the circle, such as a diversity antenna; and a control and measurement apparatus 100 connected thereto. The control and measurement apparatus 100 includes: a network analyzer 111, a divider 112, a phase-shift circuit 113, an attenuation circuit 114, a D/A converter 115, and a computer 110. The network analyzer 111 generates a radio frequency signal, and the divider 112 divides the generated radio frequency signal in accordance with the number of the scatterer antennas 121-1 to 121-7. The phase-shift circuit 113 and the attenuation circuit 114 adjust the phases and amplitudes of the divided radio frequency signals. The adjusted radio frequency signals are radiated from the scatterer antennas 121-1 to 121-7, respectively. Radio frequency signals received by the antenna under measurement 122 are inputted to the network analyzer 111. The computer 110 controls the network analyzer 111 and controls the amounts of phase adjustments made by the phase-shift circuit 113 and the amounts of amplitude adjustments (amounts of attenuation) made by the attenuation circuit 114 through the D/A converter 115. The antenna evaluation apparatus controls the amplitudes and phases of radio frequency signals to be radiated from the scatterer antennas 121-1 to 121-7, and thus controls the property of a multipath propagation environment (a fading environment, etc.) which is formed around the center of the circle by the radiated radio frequency signals. Then, a performance in an actual use environment is evaluated by the antenna under measurement 122 disposed near the center of the circle.

In addition, in recent years, a MIMO (Multi-Input Multi-Output) antenna apparatus for transmitting and receiving radio signals of a plurality of channels using a plurality of antenna elements simultaneously has been developed. FIG. 33 is a schematic diagram showing a MIMO wireless communication system including: a MIMO transmitter 200 with two transmitting antennas 201 and 202; and a MIMO receiver 210 with two receiving antennas 211 and 212. The MIMO transmitter 200 converts a data stream to be transmitted into a plurality of (in this case, two) substreams, and transmits the respective substreams from corresponding transmitting antennas 201 and 202. In this case, a first substream transmitted from the transmitting antenna 201 travels through a first channel 221 and arrives at the receiving antenna 211, and travels through a second channel 222 and arrives at the receiving antenna 212. Likewise, a second substream transmitted from the transmitting antenna 202 travels through a third channel 223 and arrives at the receiving antenna 211, and travels through a fourth channel 224 and arrives at the receiving antenna 212.

CITATION LIST

Patent Literature

PATENT LITERATURE 1: Japanese Patent Laid-open Publication No. 2005-227213.
PATENT LITERATURE 2: Japanese Patent No. 3816499.

Non-Patent Literature

NON-PATENT LITERATURE 1: Yoshio Karasawa, "Radiowave Propagation Fundamentals for Digital Mobile Communications", CORONA PUBLISHING CO., LTD., pp. 5-8, March 2003.
NON-PATENT LITERATURE 2: Tsutomu Sakata et al., "Evaluation of Mobile Terminal Antennas using Spatial Fading Emulator", Matsushita Technical Journal, Vol. 52, No. 5, pp. 70-75, October 2006.
NON-PATENT LITERATURE 3: Tsutomu Sakata et al., "Channel Capacity Measurements of a MIMO Antenna under a Rayleigh-fading Channel by a Spatial Fading Emulator", Proceedings of the 2007 IEICE Society Conference, B-1-9, September 2007.
NON-PATENT LITERATURE 4: Tsutomu Sakata et al., "A Multipath Measurement System with a Variable Power Angular Spectrum for Handset MIMO Antennas", IEICE Technical Report, Vol. 108, No. 5, pp. 13-18, April 2008.
NON-PATENT LITERATURE 5: Tsutomu Sakata et al., "An Evaluation of the MIMO Transmission Characteristics in a Cluster Propagation Environment Using a Spatial Fading Emulator", IEICE Technical Report, Vol. 108, No. 429, pp. 121-126, April 2009.

SUMMARY OF INVENTION

When evaluating an antenna's performance in a multipath propagation environment, it is necessary to consider differences among propagation times of radio waves traveling various propagation paths, i.e., delays due to the multipath.

Further, if using the antenna evaluation apparatus of FIG. 32 to evaluate the performance of the MIMO wireless communication system of FIG. 33, it is necessary to create different multipath propagation environments for different substreams transmitted from the MIMO transmitter, under an assumption that the substreams travel different propagation paths.

At present, standardization of methods for measuring wireless communication systems is in progress in the EU. A sophisticated radio wave model called "SCME (Spatial Channel Model Extended)" is likely to be standardized. SCME defines a model including a plurality of delayed waves. The different delayed waves need to produce different fadings, preferably, fadings having no correlation with each other.

An object of the present invention is to solve the above-described problems, and provide an antenna evaluation apparatus capable of creating a multipath propagation environment including fadings and delays due to multipath propagation of radio waves, when evaluating the performance of receiving antennas of a MIMO wireless communication system, as well as provide an antenna evaluation method using the same antenna evaluation apparatus.

According to the first aspect of the present invention, an antenna evaluation apparatus is provided, having a receiving antenna to be evaluated and a plurality of scatterer antennas provided around the receiving antenna. The antenna evaluation apparatus is provided with: a plurality of signal generators each generating a radio frequency signal; delaying means for adding delay times independent from each other to the generated respective radio frequency signals, and outputting resulting radio frequency signals; dividing means for dividing each of the radio frequency signals outputted from the delaying means; first radio frequency circuit means for adjusting phases and amplitudes of the divided respective radio frequency signals; and control means for controlling the delaying means to add the delay times to the generated respective radio frequency signals, and controlling the first radio frequency circuit means to change the phases and amplitudes of the divided respective radio frequency signals to produce a first fading. With respect to each of the radio frequency signals generated by the signal generators, the antenna evaluation apparatus radiates the radio frequency signals whose phases and amplitudes are adjusted by the first radio frequency circuit means, from the scatterer antennas, thus creating multipath waves including delay and the first fading around the receiving antenna.

The antenna evaluation apparatus is further provided with a plurality of combiners, each combining the radio frequency signals whose phases and amplitudes are adjusted by the first radio frequency circuit means, so as to combine the radio frequency signals corresponding to the respective radio frequency signals generated by the different signal generators. At least one of the scatterer antennas radiates the combined radio frequency signals.

Moreover, in the antenna evaluation apparatus, the first radio frequency circuit means includes a plurality of phase-shift means and a plurality of amplitude adjusting means. The antenna evaluation apparatus is further provided with a plurality of combiners, and each of the combiners combines the radio frequency signals which are divided by the dividing means and whose phases are adjusted by the respective phase-shift means, so as to combine the radio frequency signals corresponding to the respective radio frequency signals generated by the different signal generators. Each of the amplitude adjusting means adjusts an amplitude of a corresponding one of the combined radio frequency signals.

Further, the antenna evaluation apparatus is further provided with a combiner for combining the radio frequency signals generated by the signal generators, and sending the combined radio frequency signal to the dividing means. Each of the radio frequency signals divided by the dividing means includes the radio frequency signals corresponding to the respective radio frequency signals generated by the different signal generators.

Furthermore, the antenna evaluation apparatus is further provided with second radio frequency circuit means being provided between the dividing means and the first radio frequency circuit means, for adjusting the phases and amplitudes of the divided respective radio frequency signals. The control means controls the second radio frequency circuit means to adjust the phases and amplitudes of the radio frequency signals to set a distribution of incoming waves.

Moreover, in the antenna evaluation apparatus, the delaying means further generates at least one delayed radio frequency signal from each of the radio frequency signals generated by the signal generators, adds second fadings different from each other to each of the generated radio frequency signals and to each of the delayed radio frequency signals, respectively, combines the radio frequency signals to which the second fadings are added, and outputs the combined radio frequency signals.

Further, in the antenna evaluation apparatus, the second fadings different from each other have no correlation with each other.

Furthermore, in the antenna evaluation apparatus, the delaying means includes fading simulators.

According to the second aspect of the present invention, an antenna evaluation apparatus is provided, having a receiving antenna to be evaluated and a plurality of scatterer antennas provided around the receiving antenna, the scatterer antennas being arranged to make M sets of scatterer antennas, each set of scatterer antennas including a number of the scatterer antennas, each set of scatterer antennas being provided close together in one of a plurality of M directions toward the receiving antenna. The antenna evaluation apparatus is provided with: a plurality of signal generators each generating a radio frequency signal; first dividing means for outputting M radio frequency signals, each outputted radio frequency signal including the radio frequency signals generated by the respective signal generators; M delaying means for adding delay times independent from each other to the M respective radio frequency signals outputted from the first dividing means, and outputting resulting radio frequency signals; M second dividing means each dividing a corresponding one of the M radio frequency signals outputted from the respective delaying means; M radio frequency circuit means each adjusting phases and amplitudes of the radio frequency signals divided by a corresponding one of the M second dividing means; and control means for controlling the M respective delaying means to acid the delay times to the M respective radio frequency signal outputted from the first dividing means, and controlling each of the M radio frequency circuit means to change the phases and amplitudes of the radio frequency signals divided by a corresponding one of the M second dividing means to produce a fading. With respect to each of the M radio frequency signals outputted from the first dividing means, the antenna evaluation apparatus radiates the radio frequency signals whose phases and amplitudes are adjusted by a corresponding one of the radio frequency circuit means, from the scatterer antennas included in a corresponding set of the M sets of scatterer antennas, thus creating clusters of incoming waves around the receiving antenna, and creating multipath waves including delay and the fading around the receiving antenna.

According to the third aspect of the present invention, an antenna evaluation apparatus is provided, having a receiving antenna to be evaluated and a plurality of scatterer antennas provided around the receiving antenna, the scatterer antennas being arranged to make M sets of scatterer antennas, each set of scatterer antennas including a number of the scatterer antennas, each set of scatterer antennas being provided close together in one of a plurality of M directions toward the receiving antenna. The antenna evaluation apparatus is provided with: a plurality of signal generators each generating a radio frequency signal; first dividing means for outputting M radio frequency signals, each outputted radio frequency signal including the radio frequency signals generated by the respective signal generators; M delaying means for adding delay times independent from each other and amounts of phase adjustment independent from each other, to the M respective radio frequency signals outputted from the first dividing means, and outputting resulting radio frequency signals; M second dividing means each dividing a corresponding one of the M radio frequency signals outputted from the respective delaying means; M radio frequency circuit means each adjusting amplitudes of the radio frequency signals divided by a corresponding one of the M second dividing means; and control means for controlling the M respective delaying means to add the delay times to the M respective radio frequency signal outputted from the first dividing means, and controlling the M respective radio frequency circuit means and the M respective delaying means to change the phases and amplitudes of the corresponding radio frequency signals to produce a fading. With respect to each of the M radio frequency signals outputted from the first dividing means, the antenna evaluation apparatus radiates the radio frequency signals whose phases and amplitudes are adjusted by a corresponding one of the radio frequency circuit means, from the scatterer antennas included in a corresponding set of the M sets of scatterer antennas, thus creating clusters of incoming waves around the receiving antenna, and creating multipath waves including delay and the fading around the receiving antenna.

In the antenna evaluation apparatus, each of the delaying means is a fading simulator.

According to the fourth aspect of the present invention, an antenna evaluation apparatus is provided, having a receiving antenna to be evaluated and a plurality of scatterer antennas provided around the receiving antenna, the scatterer antennas being arranged to make M sets of scatterer antennas, each set of scatterer antennas including a number of the scatterer antennas, each set of scatterer antennas being provided close together in one of a plurality of M directions toward the receiving antenna. The antenna evaluation apparatus is provided with: a plurality of signal generators each generating a radio frequency signal; a plurality of signal processing means each processing a corresponding one of the generated radio frequency signals; and control means. Each of the signal processing means includes: first dividing means for dividing a corresponding one of the generated radio frequency signals; a plurality of delaying means for adding delay times independent from each other to the respective radio frequency signals divided by the first dividing means, and outputting resulting radio frequency signals; a plurality of second dividing means each dividing a corresponding one of the radio frequency signals outputted from the respective delaying means; and a plurality of radio frequency circuit means each adjusting phases and amplitudes of the radio frequency signals divided by a corresponding one of the second dividing means. The control means controls the respective delaying means to add the delay times to the respective radio frequency signal divided by the first dividing means, and controls each of the radio frequency circuit means to change the phases and amplitudes of the radio frequency signals divided by a corresponding one of the second dividing means to produce a first fading. With respect to each of the radio frequency signals divided by the first dividing means, the antenna evaluation apparatus radiates the radio frequency signals whose phases and amplitudes are adjusted by a corresponding one of the radio frequency circuit means, from the scatterer antennas included in a corresponding set of the sets of scatterer antennas, thus creating clusters of incoming waves around the receiving antenna, and creating multipath waves including delay and the first fading around the receiving antenna.

The antenna evaluation apparatus is further provided with a plurality of combiners, each combining the radio frequency signals whose phases and amplitudes are adjusted by the first radio frequency circuit means, so as to combine the radio frequency signals corresponding to the respective radio frequency signals generated by the different signal generators. At least one of the scatterer antennas radiates the combined radio frequency signals.

In the antenna evaluation apparatus, each of the delaying means further generates at least one delayed radio frequency signal from a corresponding one of the radio frequency signals divided by the first dividing means, adds second fadings different from each other to the corresponding one of the divided radio frequency signals and to the delayed radio frequency signal, respectively, combines the radio frequency signals to which the second fadings are added, and outputs the combined radio frequency signal.

In the antenna evaluation apparatus, the second fadings different from each other have no correlation with each other.

In the antenna evaluation apparatus, each of the delaying means is a fading simulator.

Moreover, in the antenna evaluation apparatus, the radio frequency signals are radio frequency signals transmitted using a MIMO communication scheme.

According to the fifth aspect of the present invention, an antenna evaluation method is provided for evaluating a receiving antenna by using an antenna evaluation apparatus including the receiving antenna to be evaluated and a plurality of scatterer antennas provided around the receiving antenna. The antenna evaluation apparatus is provided with: a plurality of signal generators each generating a radio frequency signal; delaying means for adding delay times independent from each other to the generated respective radio frequency signals, and outputting resulting radio frequency signals; dividing means for dividing each of the radio frequency signals outputted from the delaying means; and radio frequency circuit means for adjusting phases and amplitudes of the divided respective radio frequency signals. The antenna evaluation method includes the steps of: controlling the delaying means to add the delay times to the generated respective radio frequency signals, and controlling the radio frequency circuit means to change the phases and amplitudes of the divided respective radio frequency signals to produce a fading, with respect to each of the radio frequency signals generated by the signal generators, radiating the radio frequency signals whose phases and amplitudes are adjusted by the first radio frequency circuit means, from the scatterer antennas, thus creating multipath waves including delay and the first fading around the receiving antenna.

According to the antenna evaluation apparatus and the antenna evaluation method of the present invention, when evaluating the performance of receiving antennas of a MIMO wireless communication system, it is possible to create a multipath propagation environment including different fadings and different delays for different substreams transmitted from a MIMO transmitter, under an assumption that the substreams travel different propagation paths.

Moreover, according to the antenna evaluation apparatus and the antenna evaluation method of the present invention, when evaluating the performance of receiving antennas of a MIMO wireless communication system, it is possible to create a multipath propagation environment having different angle of arrival for different clusters (spatial clusters) and different delay times for different clusters (temporal clusters), under an assumption that incoming waves for different clusters travel different propagation paths.

Further, according to the antenna evaluation apparatus and the antenna evaluation method of the present invention, when evaluating the performance of receiving antennas of a MIMO wireless communication system, it is possible to produce spatial fadings, and at the same time, to produce different fadings for different delayed waves (preferably, fadings having no correlation with each other).

DETAILED DESCRIPTION OF INVENTION

Figure 1:
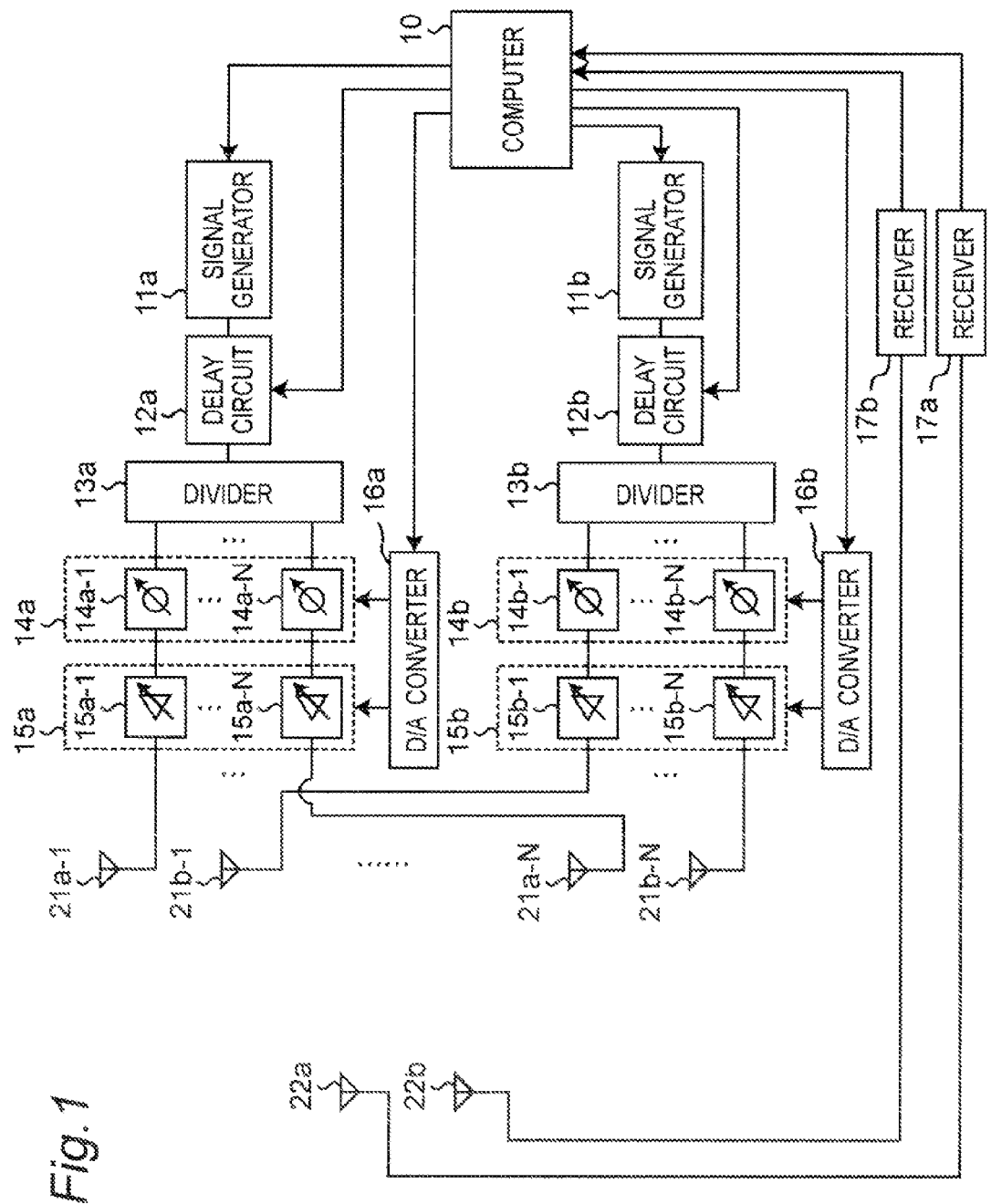
FIG. 1 is a block diagram showing a configuration of an antenna evaluation apparatus according to a first embodiment of the present invention.

Embodiments according to the present invention will be described below with reference to the drawings. Note that in the following embodiments like components are denoted by the same reference numerals.

First Embodiment

Figure 33:
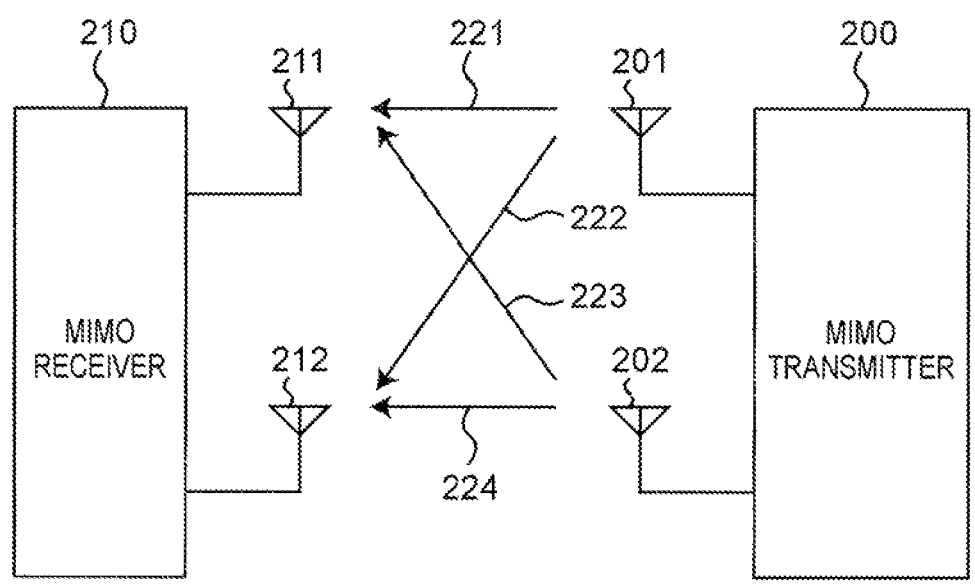
FIG. 33 is a schematic diagram showing a MIMO wireless communication system.

FIG. 1 is a block diagram showing a configuration of an antenna evaluation apparatus according to a first embodiment of the present invention. The antenna evaluation apparatus includes: two receiving antennas 22a and 22b disposed to be close to each other; and a plurality of scatterer antennas 21a-1 to 21a-N and 21b-1 to 21b-N disposed to surround the receiving antennas 22a and 22b. In the present embodiment, the two receiving antennas 22a and 22b are provided as, for example, two receiving antennas of a MIMO receiver to be evaluated. In addition, the scatterer antennas 21a-1 to 21a-N create multipath waves around the receiving antennas 22a and 22b, the multipath waves corresponding to, for example, a first substream radiated from a first transmitting antenna of a MIMO transmitter having two transmitting antennas and transmitting two substreams. The scatterer antennas 21b-1 to 21b-N create multipath waves around the receiving antennas 22a and 22b, the multipath waves corresponding to a second substream radiated from a second transmitting antenna of the same MIMO transmitter. Thus, the antenna evaluation apparatus of the present embodiment creates a multipath propagation environment in a MIMO wireless communication system including the MIMO transmitter with the two transmitting antennas and the MIMO receiver with the two receiving antennas, as shown in FIG. 33.

In the antenna evaluation apparatus of FIG. 1, signal generators 11a and 11b generate certain modulated radio frequency signals which respectively correspond to the two substreams transmitted from the MIMO transmitter, and which have no correlation with each other (or are orthogonal to each other). The signal generators 11a and 11b are followed by delay circuits 12a and 12b, respectively. In the present embodiment, under an assumption that the substreams transmitted from the MIMO transmitter travel various propagation paths, given delay times independent from each other are added to the substreams. The delay circuits 12a and 12b are followed by dividers 13a and 13b, respectively. The divider 13a divides a radio frequency signal inputted from the delay circuit 12a into N radio frequency signals in accordance with the number of the scatterer antennas 21a-1 to 21a-N. Likewise, the divider 13b divides a radio frequency signal inputted from the delay circuit 12b into N radio frequency signals in accordance with the number of the scatterer antennas 21b-1 to 21b-N. The divider 13a is followed by a phase-shift circuit 14a including phase shifters 14a-1 to 14a-N and an attenuation circuit 15a including attenuators 15a-1 to 15a-N. The phase shifters 14a-1 to 14a-N and the attenuators 15a-1 to 15a-N adjust the phases and amplitudes of the corresponding divided radio frequency signals. The adjusted radio frequency signals are radiated from the corresponding scatterer antennas 21a-1 to 21a-N. Likewise, the divider 13b is followed by a phase-shift circuit 14b including phase shifters 14b-1 to 14b-N and an attenuation circuit 15b including attenuators 15b-1 to 15b-N. The phase shifters 14b-1 to 14b-N and the attenuators 15b-1 to 15b-N adjust the phases and amplitudes of the corresponding divided radio frequency signals. The adjusted radio frequency signals are radiated from the corresponding scatterer antennas 21b-1 to 21b-N. The radiated 2N radio frequency signals are superposed as multipath waves around the center space surrounded by the scatterer antennas 21a-1 to 21a-N and 21b-1 to 21b-N, and the multipath waves arrive at the receiving antennas 22a and 22b. The radio frequency signals having arrived at the receiving antennas 22a and 22b are measured by receivers 17a and 17b, respectively. A computer 10 controls the signal generators 11a and 11b, controls the delay times of the delay circuits 12a and 12b, controls the amounts of phase adjustment by the phase-shift circuit 14a and the amounts of amplitude adjustment (the amounts of attenuation) by the attenuation circuit 15a through a D/A converter 16a, and controls the amounts of phase adjustment by the phase-shift circuit 14b and the amounts of amplitude adjustment (the amounts of attenuation) by the attenuation circuit 15b through a D/A converter 16b. The computer 10 also obtains results of the measurements of the radio frequency signals from the receivers 17a and 17b. Further, the signal generators 11a and 11b and the receivers 17a and 17b are synchronized with each other using in a well known manner.

Figure 2:
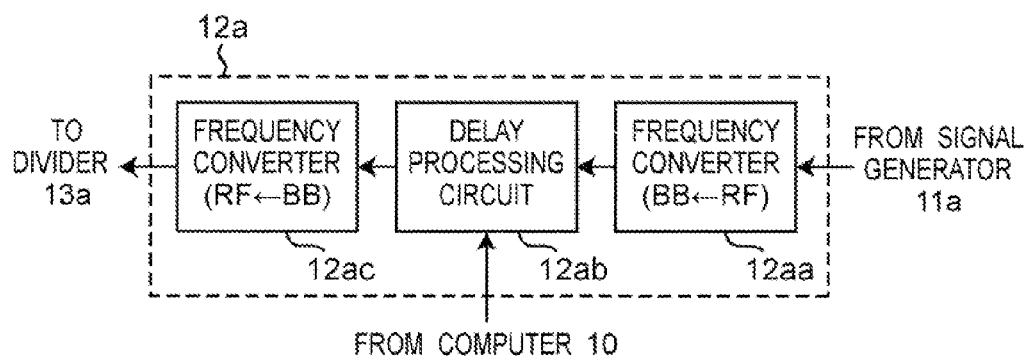
FIG. 2 is a block diagram showing a detailed configuration of a delay circuit 12a of FIG. 1.

FIG. 2 is a block diagram showing a detailed configuration of the delay circuit 12a of FIG. 1. The delay circuit 12a of the present embodiment operates in a baseband for delaying signals. Specifically, in the delay circuit 12a, a radio frequency signal inputted from the signal generator 11a is firstly converted from a radio frequency (RF) to a baseband frequency (BB) by a frequency converter 12aa, and the baseband signal is sent to a delay processing circuit 12ab. The delay processing circuit 12ab is configured from a well known delay element such as an electrical delay line or a FIFO memory, and delays the inputted baseband signal by a given time under the control of the computer 10. The delayed signal is converted from the baseband frequency (BB) to the radio frequency (RF) by a frequency converter 12ac, and the radio frequency signal is sent to the divider 13a. The other delay circuit 12b is also configured in the same manner as that of the delay circuit 12a.

Figure 3:
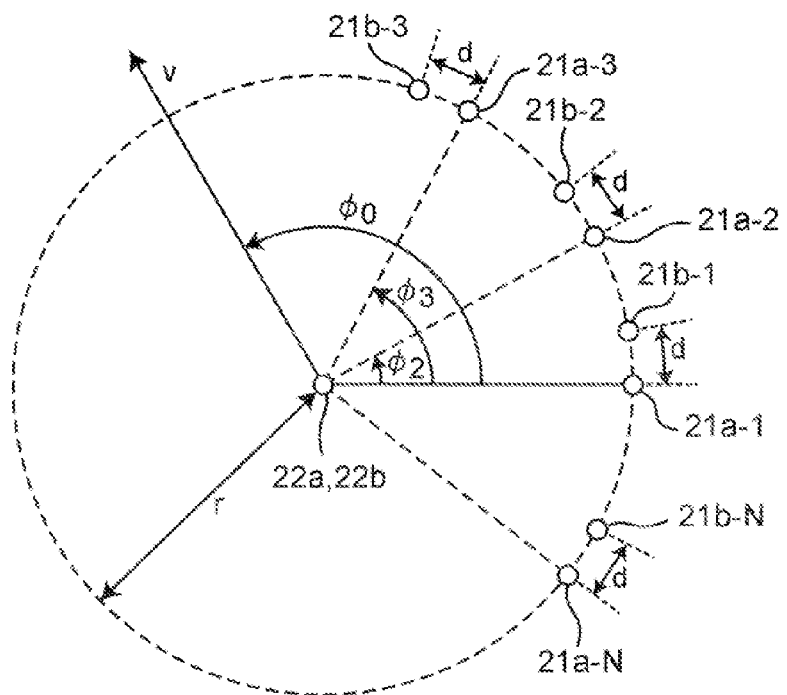
FIG. 3 is a plan view showing an arrangement of antennas for the antenna evaluation apparatus of FIG. 1.
Figure 32:
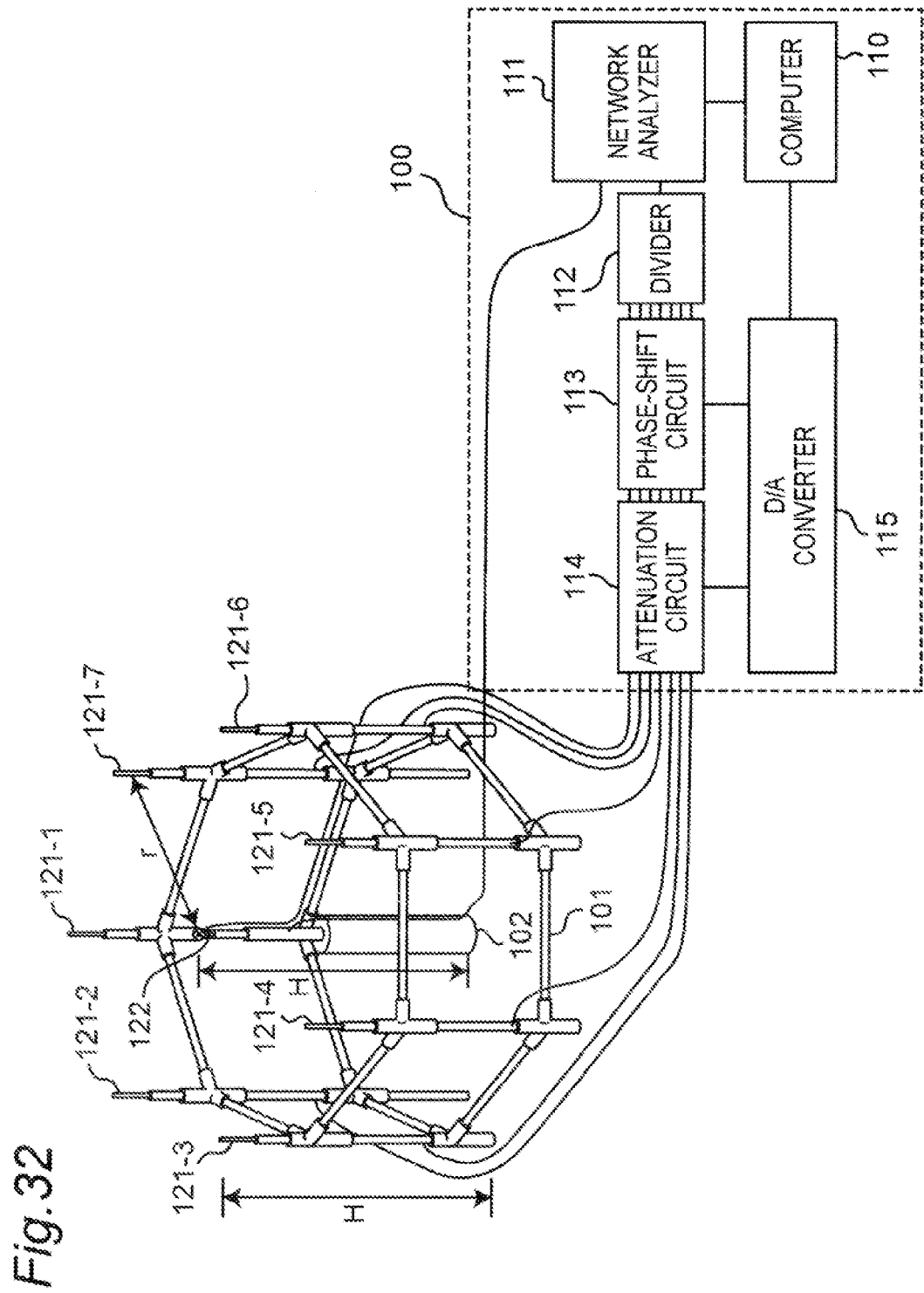
FIG. 32 is a block diagram showing a configuration of a prior art antenna evaluation apparatus.

FIG. 3 is a plan view showing an arrangement of antennas for the antenna evaluation apparatus of FIG. 1. As shown in FIG. 3, the scatterer antennas 21a-1 to 21a-N and 21b-1 to 21b-N are disposed on the circumference of a circle with a radius r so as to be spaced in angle from each other, and the two receiving antennas 22a and 22b are disposed near a center of the circle. Let a direction of the scatterer antenna 21a-1 from the center of the circle have an angle $\phi_1=0$ as a reference direction, let a direction of the scatterer antenna 21a-2 have an angle $\phi_2$, let a direction of the scatterer antenna 21a-3 have an angle $\phi_3$, and similarly, let a direction of the scatterer antenna 21a-N have an angle $\phi_N$. On the circumference of the circle, the scatterer antenna 21b-1 is located remote from the scatterer antenna 21a-1 by a distance d (e.g., a distance equal to one-half wavelength of radio frequency signals to be transmitted), the scatterer antenna 21b-2 is located remote from the scatterer antenna 21a-2 by the distance d, the scatterer antenna 21b-3 is located remote from the scatterer antenna 21a-3 by the distance d, and similarly, the scatterer antenna 21b-N is located remote from the scatterer antenna 21a-N by the distance d. The arrangement of the scatterer antennas 21a-1 to 21a-N and 21b-1 to 21b-N is not limited to that shown in FIG. 3, and any arrangement may be used as long as desired multipath waves can be created around the receiving antennas 22a and 22b. For example, the scatterer antennas 21a-1 to 21a-N and 21b-1 to 21b-N may be disposed on the circumference of a circle at an equal angular width. The receiving antennas 22a and 22b are spaced apart from each other by a distance (e.g., a distance equal to one-half wavelength of radio frequency signals to be received) according to the structure of a MIMO receiver to be evaluated. The scatterer antennas 21a-1 to 21a-N and 21b-1 to 21b-N are mounted at a height H from the floor, for example, using a scatterer antenna support 101 shown in FIG. 32. Likewise, the receiving antennas 22a and 22b are mounted at the height H from the floor, for example, using a receiving antenna support 102 shown in FIG. 32. In the present embodiment, each of the scatterer antennas 21a-1 to 21a-N and 21b-1 to 21b-N and the receiving antennas 22a and 22b is configured as, for example, a half-wavelength dipole antenna, but is not limited thereto. In addition, each of the scatterer antennas 21a-1 to 21a-N and 21b-1 to 21b-N and the receiving antennas 22a and 22b is mounted, for example, vertically to the floor and transmits and receives vertically polarized radio waves, but the arrangement is not limited thereto.

In the antenna evaluation apparatus of the present embodiment, the computer 10 controls the delay circuits 12a and 12b to add given delay times independent from each other to radio frequency signals generated by the respective signal generators 11a and 11b, controls the phase-shift circuit 14a and the attenuation circuit 15a to change the phases and amplitudes of radio frequency signals divided by the divider 13a so as to produce a fading, and controls the phase-shift circuit 14b and the attenuation circuit 15b to change the phases and amplitudes of radio frequency signals divided by the divider 13b so as to produce a fading. Further, the antenna evaluation apparatus of the present embodiment is characterized by radiating radio frequency signals generated by the signal generator 11a from the scatterer antennas 21a-1 to 21a-N to create multipath waves including delays and fadings around the receiving antennas 22a and 22b, and radiating a radio frequency signal generated by the signal generator 11b from the scatterer antennas 21b-1 to 21b-N to create multipath waves including delays and fadings around the receiving antennas 22a and 22b. Thus, according to the antenna evaluation apparatus of the present embodiment, when evaluating the performance of receiving antennas of a MIMO wireless communication system, under an assumption that substreams transmitted from a MIMO transmitter travel various propagation paths, it is possible to create a multipath propagation environment including different fadings and different delays for the different substreams.

Now, operating principles for the antenna evaluation apparatus of the present embodiment to create a multipath propagation environment including fadings will be described.

The antenna evaluation apparatus of the present embodiment can virtually produce the same fading as the fading occurring according to movement of the receiving antennas 22a and 22b. In the following explanation, reference is made a radio frequency signal generated by the signal generator 11a. In addition, for ease of explanation, it is assumed that incoming waves are uniformly distributed over all azimuth angles, and further, it is assumed that each of the receiving antennas 22a and 22b has omni-directional radiation directivity in a horizontal plane. The computer 10 can control fading characteristics by using the phase-shift circuit 14a to independently and instantaneously control the phases of N radio frequency signals divided by the divider 13a. That is, by controlling the phase changes of radio frequency signals to be radiated from the scatterer antennas 21a-1 to 21a-N, respectively, it is possible to create a superposition of multipath waves with variation due to fading (e.g., Rayleigh fading or other fading) around the center. It is assumed that, as shown in FIG. 3, the receiving antennas 22a and 22b move in the direction of an angle $\phi_0$ at a velocity v. In this case, the amount of phase change NO, which is set by a phase shifter 14a-i to a radio frequency signal to be radiated from a scatterer antenna 21a-i ($i \le 1 \le N$) located in the direction of an angle $\phi_i$, is expressed as follows.

$$p_i(t) = 2\pi \cdot t f_D \cos(\phi_0 - \phi_i) + \alpha_i \qquad \text{[Equation 1]}$$

In Equation 1, $f_D$ is the maximum Doppler frequency $v/\lambda$ for the wavelength of the radio frequency signal $\lambda$, t is the time, and $\alpha_i$ is an initial phase set to the radio frequency signal to be radiated from the scatterer antenna 21a-i. The angle $\phi_0$ can be set to any value. The maximum Doppler frequency $f_D$ can be set to any value ranging from a value corresponding to walking (several Hz) to a value corresponding to high-speed movement (several hundred Hz).

When the amount of phase change $p_i(t)$ of Equation 1 is set and $\beta$ is a propagation constant, multipath waves created around the center surrounded by the scatterer antennas 21a-1 to 21a-N have the following received signal waveform $S_n(t)$ when received by the receiving antennas 22a and 22b.

$$S_n(t) = \sum_{i=1}^{N} E_{n,i} \frac{\lambda}{4\pi \cdot r} \exp[-j\{\beta r + p_i(t)\}] \qquad \text{[Equation 2]}$$

$$= \sum_{i=1}^{N} E_{n,i} \frac{\lambda}{4\pi \cdot r} \exp$$

$$[-j\{\beta r + 2\pi \cdot t \cdot f_D \cos(\phi_0 - \phi_i) + \alpha_i\}]$$

The subscript n indicates an n-th receiving antenna (i.e., one of the receiving antennas 22a and 22b). $E_{n,i}$ is radiation directivity of the n-th receiving antenna for the radio frequency signal radiated from the scatterer antenna 21a-i. The radiation directivity $E_{n,i}$ includes its amplitude and phase, and is represented by a complex number.

Thus, the antenna evaluation apparatus of the present embodiment provides radio frequency signals to be radiated with the same phase changes as phase changes of incoming waves occurring according to a user's actual movement, and thus, creates a desired multipath propagation environment around the center. Also for radio frequency signals generated by the signal generator 11b, it is possible to create a multipath propagation environment in a similar manner to that described above. In this case, in Equation 1, angles of the respective scatterer antennas 21b-1 to 21b-N are used instead of the angles $\phi_i$ of the scatterer antennas 21a-i. As a result, it is possible to create a situation in which the receiving antennas 22a and 22b are moving, in spite of that the receiving antennas 22a and 22b are actually fixed.

In the present embodiment, it is assumed that substreams transmitted from the MIMO transmitter travel different propagation paths. Hence, in order to set different multipath propagation environments for the different substreams, the phase-shift circuits 14a and 14b may be used to set given initial phases $\alpha_i$ independent from each other to radio frequency signals generated by the respective signal generators 11a and 11b.

When creating incoming waves not uniformly distributed over all azimuth angles, the attenuation circuits 15a and 15b can be used to set a desired distribution. In addition, in order to set different multipath propagation environments for different substreams, the attenuation circuits 15a and 15b may be used to set given amounts of amplitude adjustment independent from each other to radio frequency signals generated by the respective signal generators 11a and 11b.

When using radio frequency signals in a frequency band, e.g., about 2 GHz, the height H of the scatterer antennas 21a-1 to 21a-N and 21b-1 to 21b-N and the receiving antennas 22a and 22b from the floor is set to 1.5 m, and the distance from the scatterer antennas 21a-1 to 21a-N and 21b-1 to 21b-N to the receiving antennas 22a and 22b, i.e., the radius r of the circumference of the circle on which the scatterer antennas 21a-1 to 21a-N and 21b-1 to 21b-N are disposed, is set to 1.5 m. The available frequency band and antenna arrangement are not limited thereto, and other values may be used.

The antenna evaluation apparatus of the present embodiment is preferably set up in an RF anechoic chamber. Thus, the influence of reflected waves, which are reflected by the ceiling, floor, walls, etc., is sufficiently reduced over direct waves, and multipath waves made of direct waves radiated from the scatterer antennas 21a-1 to 21a-N and 21b-1 to 21b-N are created around the receiving antennas 22a and 22b.

Figure 4:
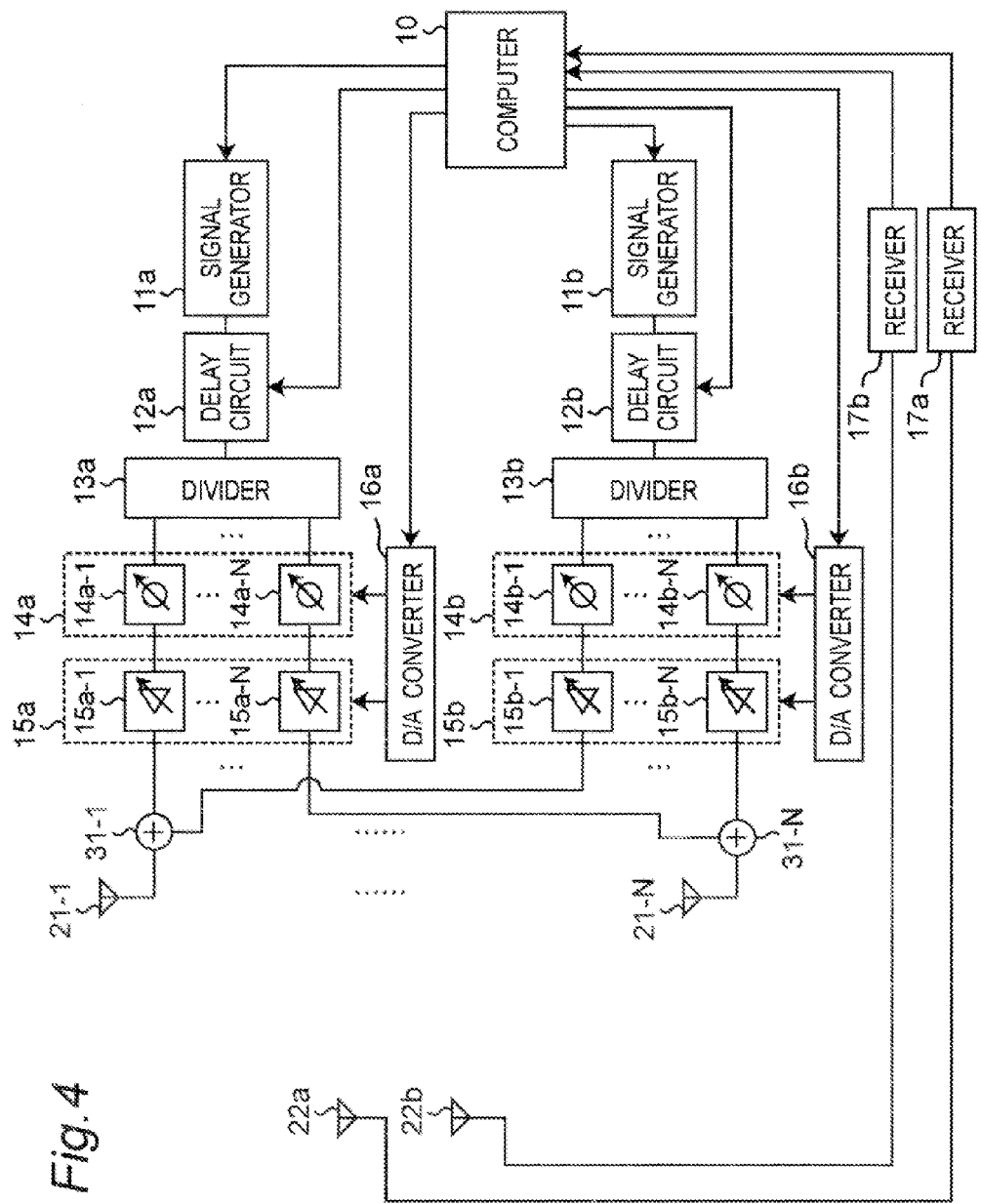
FIG. 4 is a block diagram showing a configuration of an antenna evaluation apparatus according to a first modified embodiment of the first embodiment of the present invention.
Figure 5:
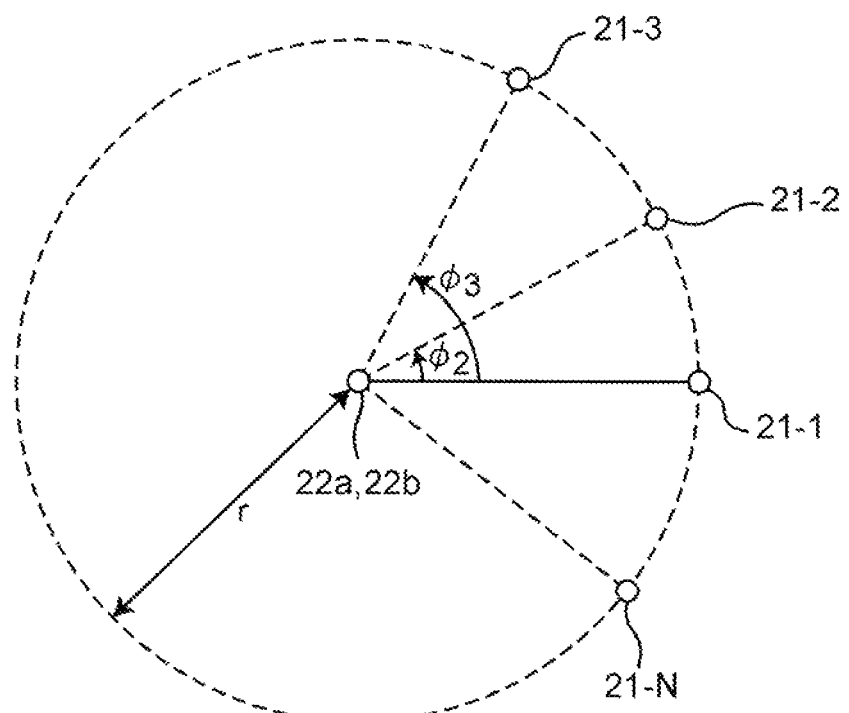
FIG. 5 is a plan view showing an arrangement of antennas for the antenna evaluation apparatus of FIG. 4.

FIG. 4 is a block diagram showing a configuration of an antenna evaluation apparatus according to a first modified embodiment of the first embodiment of the present invention. FIG. 5 is a plan view showing an arrangement of antennas for the antenna evaluation apparatus of FIG. 4. A common set of scatterer antennas 21-1 to 21-N may be used instead of providing, as shown in FIG. 1, separate sets of scatterer antennas 21a-1 to 21a-N and scatterer antennas 21b-1 to 21b-N for radio frequency signals generated by a signal generator 11a and for radio frequency signals generated by a signal generator 11b. In the present modified embodiment, output signals from attenuators 15a-1 to 15a-N and output signals from attenuators 15b-1 to 15b-N are combined with each other by corresponding combiners 31-1 to 31-N. The combined radio frequency signals are radiated from the corresponding scatterer antennas 21-1 to 21-N. Since radio frequency signals generated by the respective signal generators 11a and 11b are orthogonal to each other, the antenna evaluation apparatus of the present modified embodiment can operate in the same manner as that of the configuration of FIG. 1, even if using the common scatterer antennas 21-1 to 21-N. The antenna evaluation apparatus may be configured such that the combined radio frequency signals are radiated from at least one scatterer antenna. The scatterer antennas 21-1 to 21-N may be mounted on, for example, a scatterer antenna support 101 of FIG. 32. Thus, the antenna evaluation apparatus of the present modified embodiment can achieve a variety of distributions of radiated multipath waves in a more flexible manner, and reduce the number of scatterer antennas as compared to the configuration of FIG. 1, thus simplifying the configuration of the antenna evaluation apparatus and reducing costs.

Figure 6:
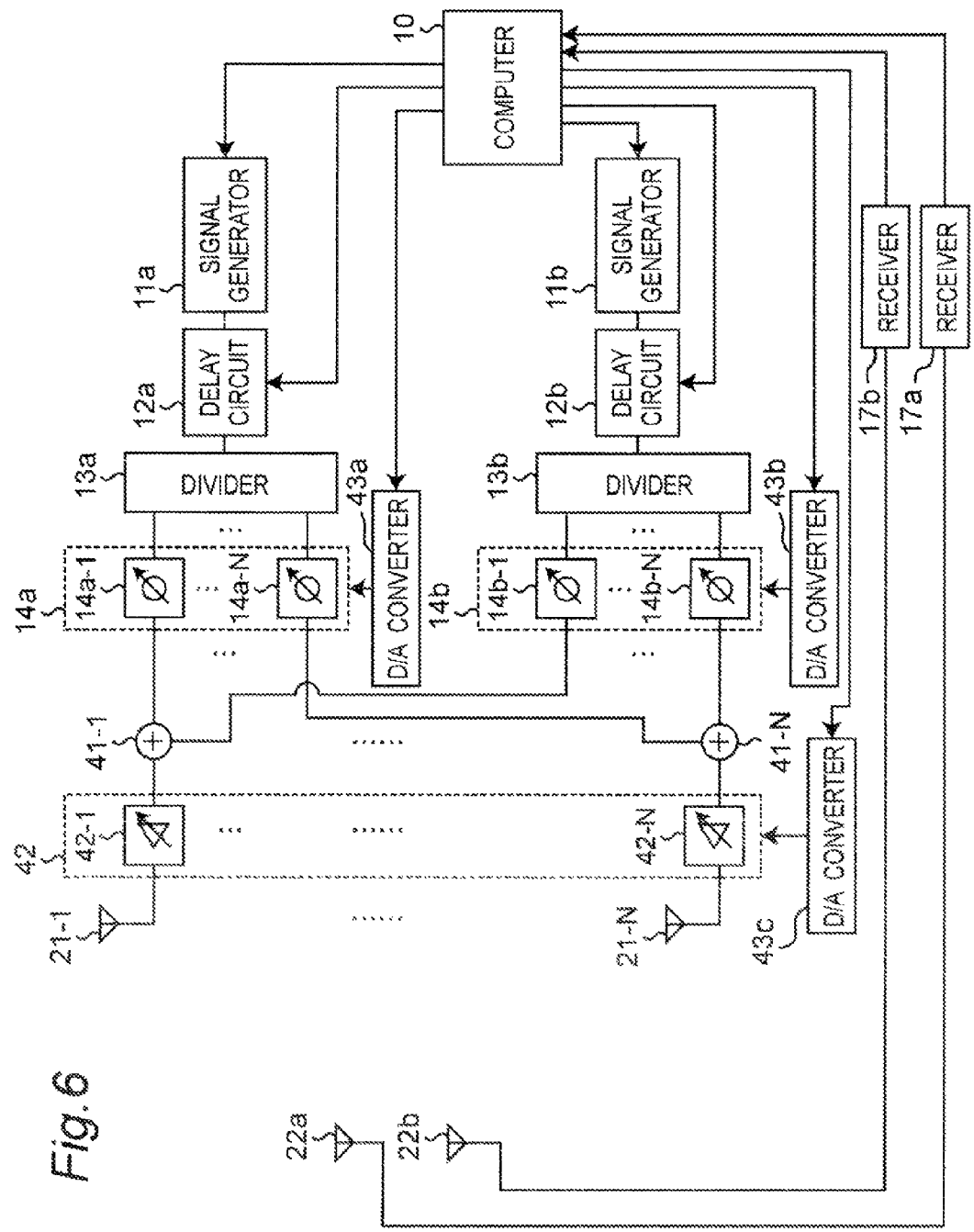
FIG. 6 is a block diagram showing a configuration of an antenna evaluation apparatus according to a second modified embodiment of the first embodiment of the present invention.

FIG. 6 is a block diagram showing a configuration of an antenna evaluation apparatus according to a second modified embodiment of the first embodiment of the present invention. If radio frequency signals generated by respective signal generators 11a and 11b have the same distribution of incoming waves, a common attenuation circuit 42 may be used instead of providing separate attenuation circuits 15a and 15b as shown in FIG. 1. In the present modified embodiment, output signals from phase shifters 14a-1 to 14a-N and output signals from phase shifters 14b-1 to 14b-N are combined with each other by corresponding combiners 41-1 to 41-N. The combined radio frequency signals are inputted to corresponding attenuators 42-1 to 42-N of the attenuation circuit 42. The attenuators 42-1 to 42-N adjust the amplitudes of corresponding inputted radio frequency signals. The adjusted radio frequency signals are radiated from corresponding scatterer antennas 21-1 to 21-N. A computer 10 controls the amounts of phase adjustment by phase-shift circuits 14a and 14b and the amounts of amplitude adjustment by the attenuation circuit 42, through D/A converters 43a, 43b, and 43c, instead of through D/A converters 16a and 16b of FIG. 1. Thus, the antenna evaluation apparatus of the present modified embodiment can reduce the numbers of scatterer antennas and attenuators as compared to the configuration of FIG. 1, thus simplifying the configuration of the antenna evaluation apparatus.

Figure 7:
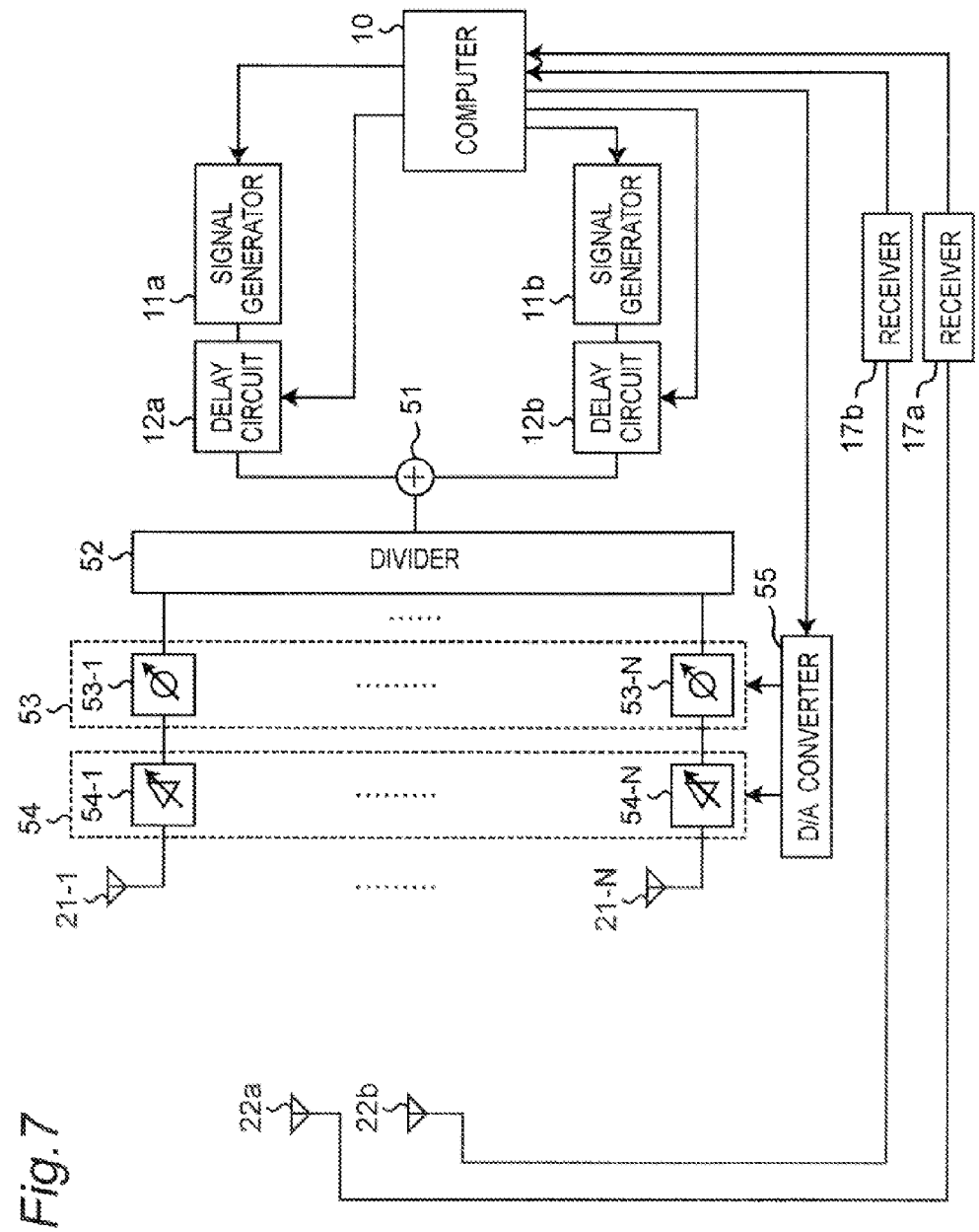
FIG. 7 is a block diagram showing a configuration of an antenna evaluation apparatus according to a third modified embodiment of the first embodiment of the present invention.

FIG. 7 is a block diagram showing a configuration of an antenna evaluation apparatus according to a third modified embodiment of the first embodiment of the present invention. If radio frequency signals generated by respective signal generators 11a and 11b have the same phase and the same distribution of incoming waves, a common phase-shift circuit 53 and a common attenuation circuit 54 may be used instead of providing separate phase-shift circuits 14a and 14b and separate attenuation circuits 15a and 15b as shown in FIG. 1. Output signals from respective delay circuits 12a and 12b are temporarily combined with each other by a combiner 51, and then the combined signal is divided into N signals by a divider 52 in accordance with the number of scatterer antennas 21-1 to 21-N. The divider 52 is followed by the phase-shift circuit 53 including phase shifters 53-1 to 53-N and the attenuation circuit 54 including attenuators 54-1 to 54-N. The phase shifters 53-1 to 53-N and the attenuators 54-1 to 54-N adjust the phases and amplitudes of the corresponding divided radio frequency signals. The adjusted radio frequency signals are radiated from the corresponding scatterer antennas 21-1 to 21-N. A computer 10 controls the amounts of phase adjustment by the phase-shift circuit 53 and the amounts of amplitude adjustment by the attenuation circuit 54 through a D/A converter 55. Thus, the antenna evaluation apparatus of the present modified embodiment can reduce the numbers of scatterer antennas, attenuators, and phase shifters as compared to the configuration of FIG. 1, thus simplifying the configuration of the antenna evaluation apparatus.

Figure 8:
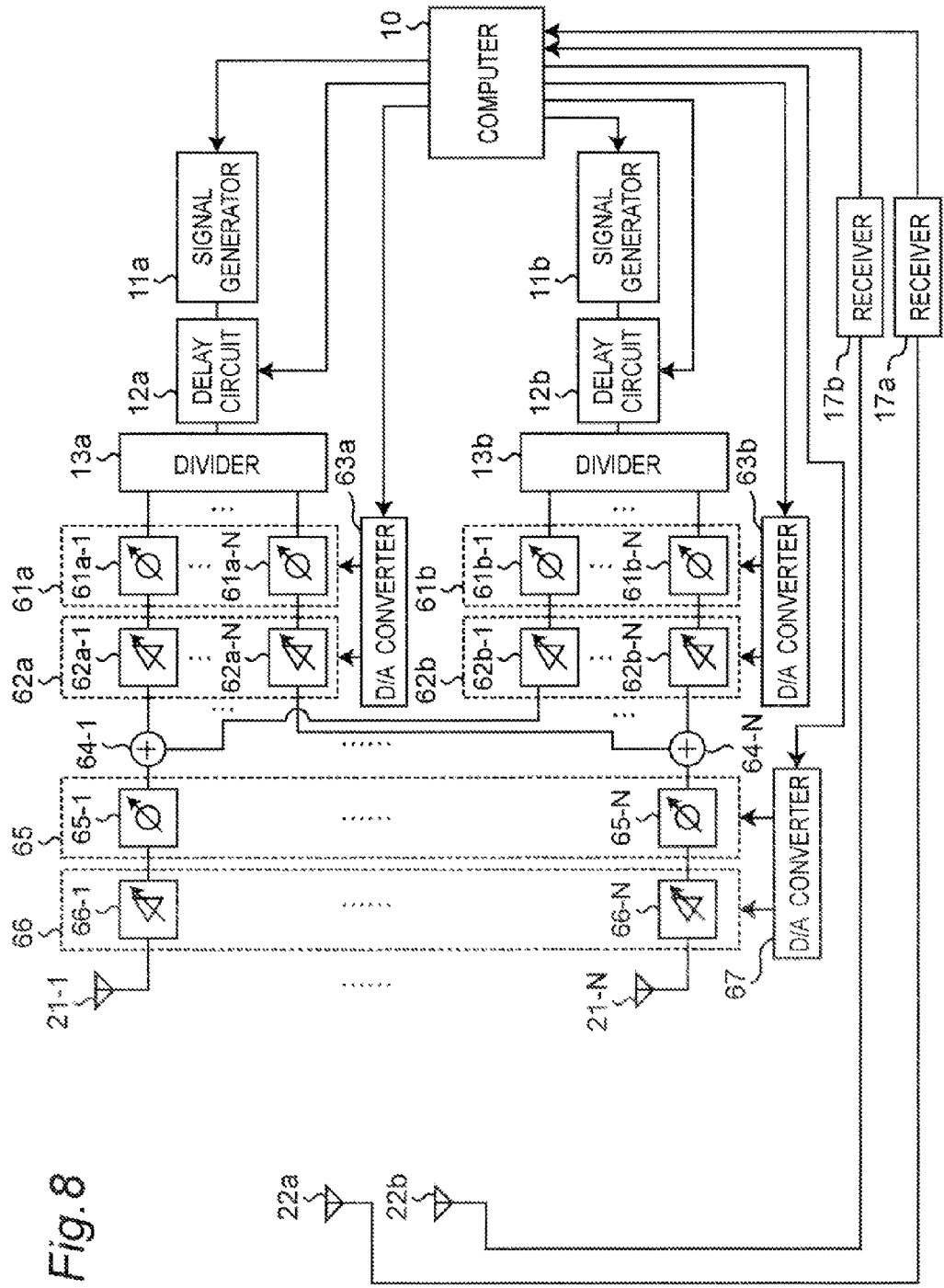
FIG. 8 is a block diagram showing a configuration of an antenna evaluation apparatus according to a fourth modified embodiment of the first embodiment of the present invention.

FIG. 8 is a block diagram showing a configuration of an antenna evaluation apparatus according to a fourth modified embodiment of the first embodiment of the present invention. The antenna evaluation apparatus of the present modified embodiment is characterized by including a phase-shift circuit 65 and an attenuation circuit 66 configured in the same manners as that of the phase-shift circuit 53 and the attenuation circuit 54 of FIG. 7, as well as by further including phase-shift circuits 61a and 61b and attenuation circuits 62a and 62b for adjusting distributions of incoming waves.

In FIG. 8, signal generators 11a and 11b, delay circuits 12a and 12b, and dividers 13a and 13b are configured in the same manners as those of the antenna evaluation apparatus of FIG. 1. The divider 13a is followed by the phase-shift circuit 61a including phase shifters 61a-1 to 61a-N and the attenuation circuit 62a including attenuators 62a-1 to 62a-N. The phase shifters 61a-1 to 61a-N and the attenuators 62a-1 to 62a-N adjust the phases and amplitudes of the corresponding divided radio frequency signals such that radio frequency signals generated by the signal generator 11a create a certain distribution of incoming waves when radiated from scatterer antennas 21-1 to 21-N, and send the adjusted radio frequency signals to corresponding combiners 64-1 to 64-N. Likewise, The divider 13b is followed by the phase-shift circuit 61b including phase shifters 61b-1 to 61b-N and the attenuation circuit 62b including attenuators 62b-1 to 62b-N. The phase shifters 61b-1 to 61b-N and the attenuators 62b-1 to 62b-N adjust the phases and amplitudes of the corresponding divided radio frequency signals such that radio frequency signals generated by the signal generator 11b create a certain distribution of incoming waves when radiated from the scatterer antennas 21-1 to 21-N, and send the adjusted radio frequency signals to the corresponding combiners 64-1 to 64-N. Each of the combiners 64-1 to 64-N combines one of the divided radio frequency signals generated by the signal generator 11a and one of the divided radio frequency signals generated by the signal generator 11b. The combiners 64-1 to 64-N is followed by the phase-shift circuit 65 including phase shifters 65-1 to 65-N and the attenuation circuit 66 including attenuators 66-1 to 66-N. The phase shifters 65-1 to 65-N and the attenuators 66-1 to 66-N adjust the phases and amplitudes of corresponding radio frequency signals to produce a fading and the adjusted radio frequency signals are radiated from the corresponding scatterer antennas 21-1 to 21-N. A computer 10 controls the amounts of phase adjustment by the phase-shift circuit 61a and the amounts of amplitude adjustment by the attenuation circuit 62a through a D/A converter 63a, controls the amounts of phase adjustment by the phase-shift circuit 61b and the amounts of amplitude adjustment by the attenuation circuit 62b through a D/A converter 63b, and controls the amounts of phase adjustment by the phase-shift circuit 65 and the amounts of amplitude adjustment by the attenuation circuit 66 through a D/A converter 67. Since the phase-shift circuit 61a and the attenuation circuit 62a are provided separately from the phase-shift circuit 61b and the attenuation circuit 62b, it is possible to change a distribution of incoming waves associated with the radio frequency signals generated by the signal generator 11a, and to independently change a distribution of incoming waves associated with the radio frequency signals generated by the signal generator 11b.

In the antenna evaluation apparatus of the present modified embodiment, the computer 10 controls the phase-shift circuit 61a and the attenuation circuit 62a to change the phases and amplitudes of radio frequency signals divided by the divider 13a so as to create a certain distribution of incoming waves, controls the phase-shift circuit 61b and the attenuation circuit 62b to change the phases and amplitudes of radio frequency signals divided by the divider 13b so as to create a certain distribution of incoming waves, and further controls the phase-shift circuit 65 and the attenuation circuit 66 to change the phases and amplitudes of the radio frequency signals combined by the combiners 64-1 to 64-N so as to produce a fading.

A distribution of incoming waves does not change at all times, and thus, the distribution of incoming waves can be considered as constant during a certain period. That is, during this period, it is sufficient to control the phase-shift circuits 61a and 61b and the attenuation circuits 62a and 62b only once in order to create desired distributions of incoming waves. On the other hand, in order to produce a fading, it is necessary to continuously provide the phase-shift circuit 65 producing the fading, with variations over time. The circuit configuration of the present modified embodiment includes 1.5 times as many phase shifters and attenuators as, for example, the circuit configuration of FIG. 4. However, since only the phase shifters 65-1 to 65-N continuously operate over time, the load for the control by the computer 10 is reduced by half.

If the antenna evaluation apparatus of the present modified embodiment is to be calibrated for amplitude, it is possible to use the attenuation circuit 66 for producing a fading, which is different from the attenuation circuits 62a and 62b for adjusting distributions of incoming waves. Thus, in the antenna evaluation apparatus, circuit elements for calibration are separated from circuit elements for adjusting distributions of incoming waves.

Second Embodiment

Figure 9:
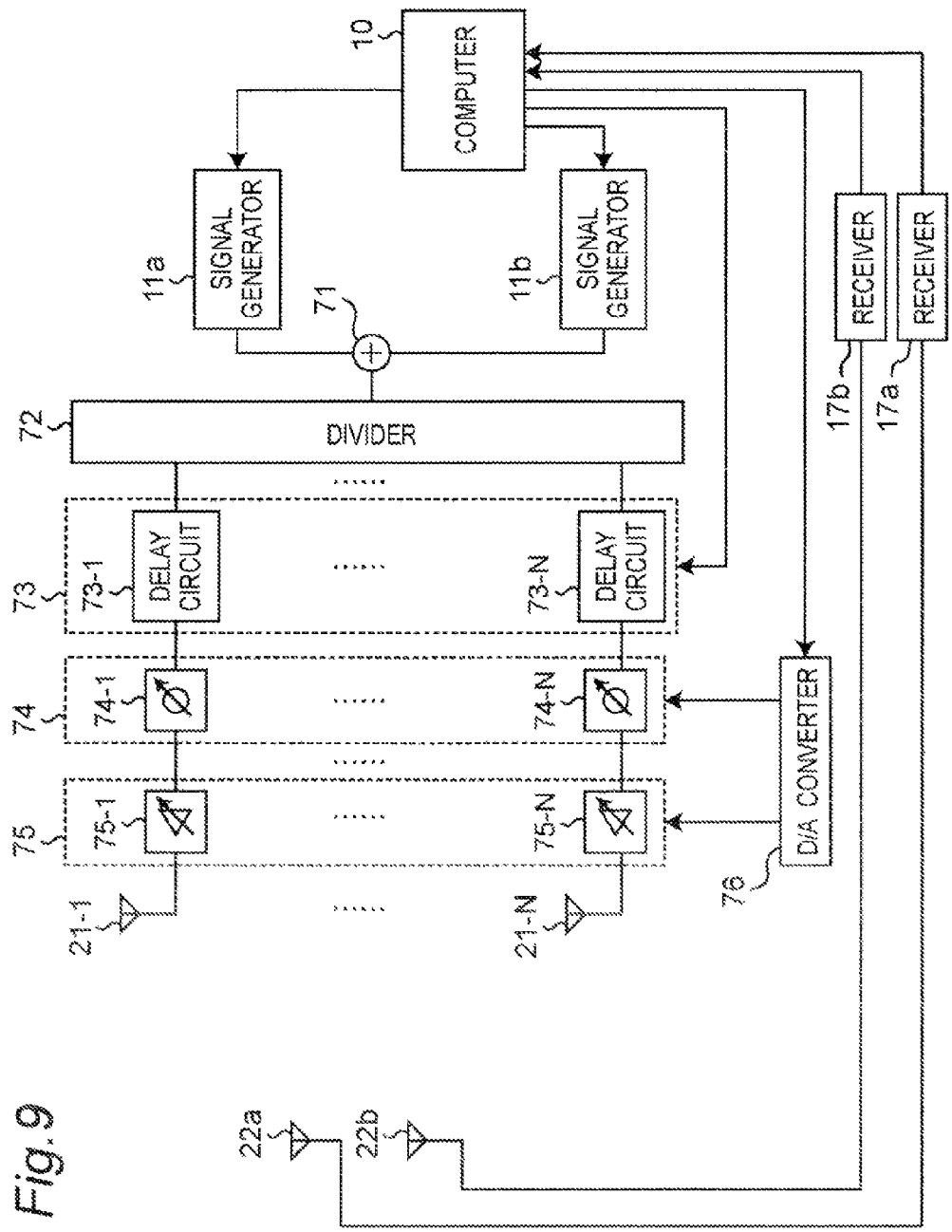
FIG. 9 is a block diagram showing a configuration of an antenna evaluation apparatus according to a second embodiment of the present invention.
Figure 10:
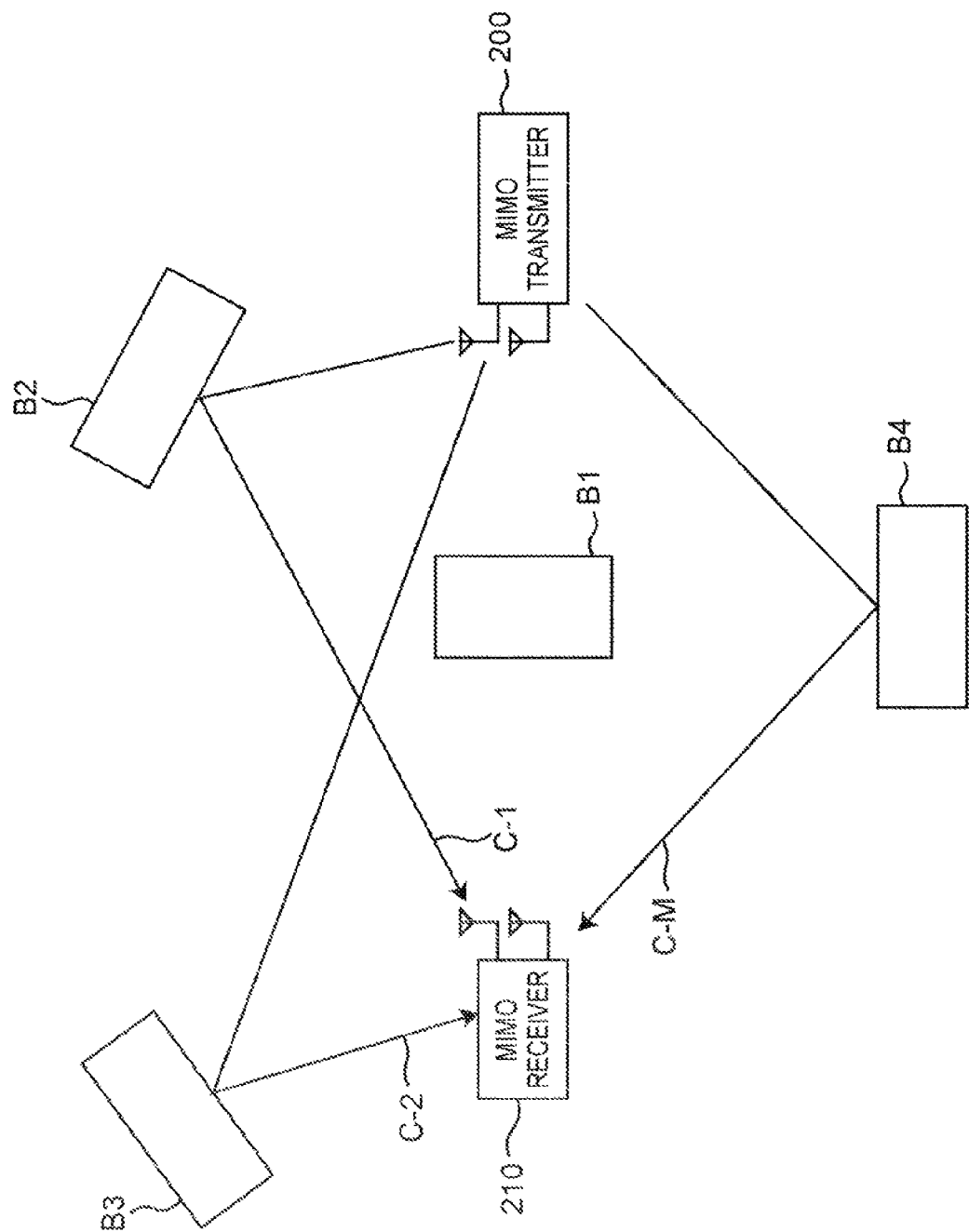
FIG. 10 is a schematic diagram showing clusters of incoming waves in an exemplary MIMO wireless communication system.

FIG. 9 is a block diagram showing a configuration of an antenna evaluation apparatus according to a second embodiment of the present invention. The present embodiment is characterized by creating a multipath propagation environment where radio waves arrive in groups, each group being in one of a small number of directions and having small angular spread, instead of a multipath propagation environment where incoming waves are uniformly distributed over all angular directions. In this specification, a group of incoming waves occurring in a certain angular direction close together is called a "cluster". FIG. 10 is a schematic diagram showing clusters of incoming waves in an exemplary MIMO wireless communication system. Radio waves radiated from a MIMO transmitter 200 are reflected by obstacles B1, B2, B3, and B4 such as buildings, and arrive at a MIMO receiver 210 from various directions as clusters C-1, C-2, and C-M. A multipath propagation environment including the clusters corresponds, for example, to a propagation environment along a street surrounded by structures such as buildings (street microcell). In such a propagation environment, radio waves arrive along the street from the front or the back, and the spatial angular spreads of incoming waves are small. The antenna evaluation apparatus of the present embodiment adds to each incoming wave, different angles of arrival for different clusters (spatial cluster) and different delay times for different clusters (temporal cluster), under an assumption that incoming waves for different clusters travel different propagation paths.

In the antenna evaluation apparatus of FIG. 9, radio frequency signals generated by respective signal generators 11a and 11b are temporarily combined with each other by a combiner 71, and then, the combined signal is divided into N signals by a divider 72 in accordance with the number of scatterer antennas 21-1 to 21-N. The divider 72 is followed by delay circuits 73-1 to 73-N (collectively indicated by reference numeral "73"), and the delay circuits 73 add to corresponding divided radio frequency signals, delay times depending on clusters to be created. The delay circuit 73 is followed by a phase-shift circuit 74 including phase shifters 74-1 to 74-N and an attenuation circuit 75 including attenuators 75-1 to 75-N. The phase shifters 74-1 to 74-N and the attenuators 75-1 to 75-N adjust the phases and amplitudes of the corresponding divided radio frequency signals. The adjusted radio frequency signals are radiated from the corresponding scatterer antennas 21-1 to 21-N. A computer 10 controls the delay times of the delay circuits 73-1 to 73-N and controls the amounts of phase adjustment by the phase-shift circuit 74 and the amounts of amplitude adjustment by the attenuation circuit 75 through a D/A converter 76.

Now, operating principles for the antenna evaluation apparatus of the present embodiment to create a multipath propagation environment including clusters of incoming waves will be described.

It is assumed that a multipath propagation environment is created in a MIMO wireless communication system including a MIMO transmitter with two transmitting antennas and a MIMO receiver with two receiving antennas as shown in FIG. 33. It is assumed that a plurality of M clusters are created by the antenna evaluation apparatus of the present embodiment. Since it is considered that radio waves radiated from the two transmitting antennas of the MIMO transmitter arrive at the two receiving antennas of the MIMO receiver through different propagation paths, it is considered that the initial phases of secondary wave sources are also different from each other. If a distribution of incoming waves for a cluster is modeled as the Gaussian distribution, a power distribution of incoming waves for a q-th cluster C-q ($1 \leq q \leq M$) $\Omega_q(\phi)$ and a power distribution of incoming waves for all clusters $\Omega(\phi)$ can be expressed as follows.

$$\Omega_q(\phi) = \frac{P_q}{\sqrt{2\pi}\,\sigma_q}\exp\left\{-\frac{(\phi-\phi_{C-q})^2}{2\sigma_q^2}\right\} \quad \text{[Equation 3]}$$

$$\Omega(\phi) = \sum_{q=1}^{M} \Omega_q(\phi) \quad \text{[Equation 4]}$$

$P_q$ is a power of the cluster C-q, $\phi_{C-q}$ is a mean angle of arrival of the cluster C-q, and $\sigma_q$ is an angular spread of the cluster C-q. The antenna evaluation apparatus of the present embodiment controls the amounts of amplitude adjustment by the attenuators 75-1 to 75-N connected to the scatterer antennas 21-1 to 21-N to eventually set N discrete radiation powers, thus achieving the power distribution of incoming waves of Equation 4. Since the Gaussian distribution of Equation 3 is not a periodic function, wrap around occurs at angles apart by 180 degrees from the center ($\phi_{C-q}+180°$ and $\phi_{C-1}-180°$). However, when creating clusters, an angular width of 180° or more is not considered.

Next, a method for measuring MIMO transmission characteristics is described. Referring to the same model as that of Equations 1 and 2, a channel response $h_{nm}$ between an m-th transmitting antenna of the MIMO transmitter (m=1, 2) and an n-th receiving antenna of the MIMO receiver (n=1, 2) is expressed as follows.

$$h_{nm} = \sum_{i=1}^{N} E_{n,i}\sqrt{\Omega(\phi_i)}\,\frac{\lambda}{4\pi\cdot r} \quad \text{[Equation 5]}$$

$$\exp[-j\{\beta r + 2\pi\cdot t\cdot f_D\cos(\phi_0-\phi_i) + \alpha_{mi}\}]$$

$E_{n,i}$ is, as described above, the radiation directivity of the n-th receiving antenna for a radio frequency signal radiated from a scatterer antenna 21-$i$. $\Omega(\phi_i)$ is a radiation power of an i-th scatterer antenna 21-$i$ defined in Equation 4. $\alpha_{mi}$ is an initial phase for the m-th transmitting antenna at the i-th scatterer antenna 21-$i$.

The computer 10 controls the amounts of phase adjustment by the phase-shift circuit 74 and the amounts of amplitude adjustment by the attenuation circuit 75, to create a multipath propagation environment represented by the channel response $h_{nm}$ of Equation 5, i.e., a multipath propagation environment including spatial clusters. Since the scatterer antennas 21-1 to 21-N are spatially disposed over all angles of arrive, the spatial clusters can be created by controlling the amounts of amplitude adjustment by the respective attenuators 75-1 to 75-N. The computer 10 further controls the delay times of the delay circuits 73-1 to 73-N to add given delay times to radio frequency signals such that the same delay time is added to those radio frequency signals included in the same cluster, thus creating a multipath propagation environment including temporal clusters. The temporal clusters can be created by controlling the delay times of the respective delay circuits 73-1 to 73-N.

As described above, according to the antenna evaluation apparatus of the present embodiment, when evaluating the performance of receiving antennas of a MIMO wireless communication system, it is possible to create a multipath propagation environment having different angles of arrival for different clusters (the spatial clusters) and having different delay times for different clusters (the temporal clusters), under an assumption that incoming waves for different clusters travel different propagation paths.

Figure 11:
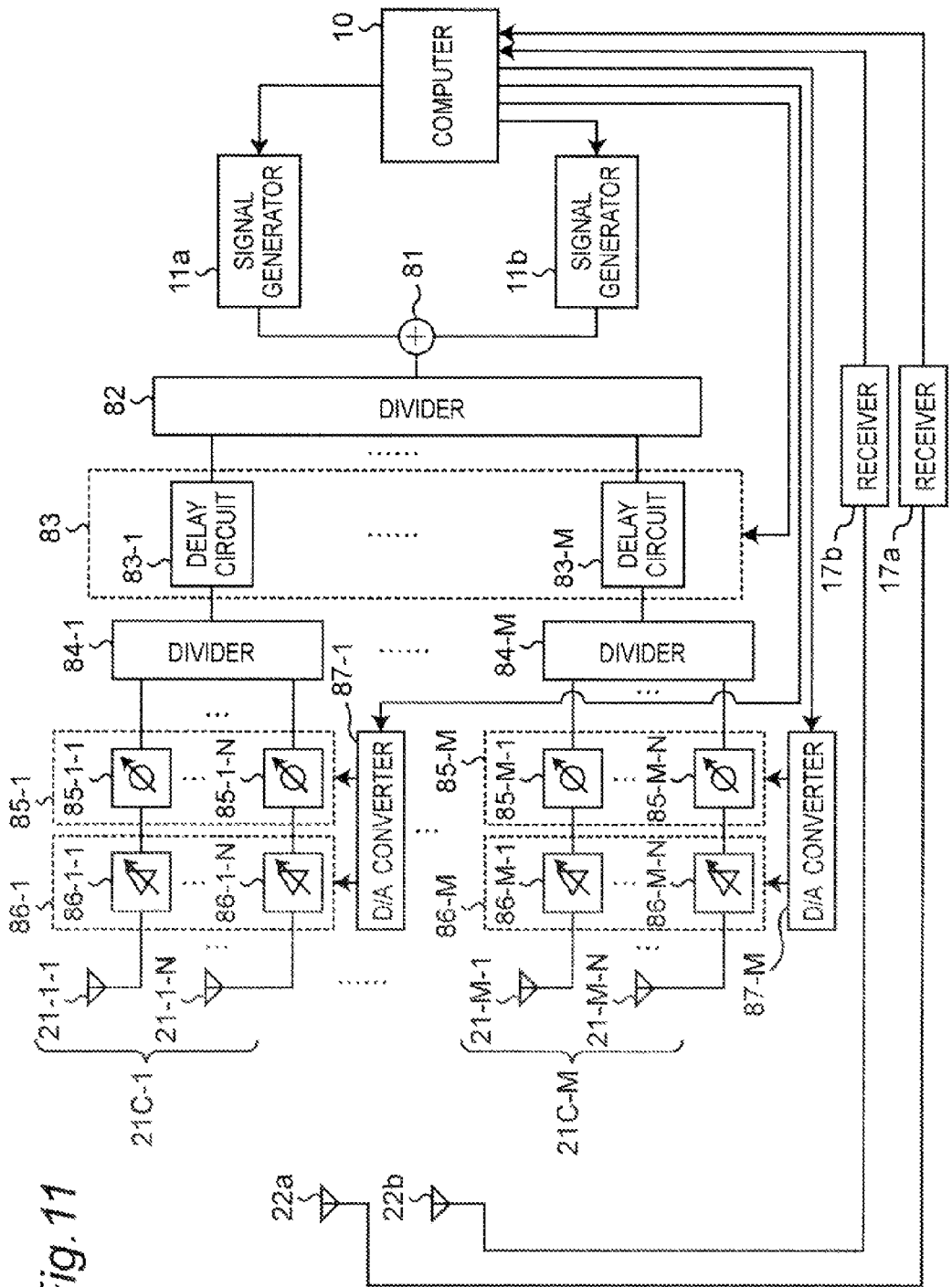
FIG. 11 is a block diagram showing a configuration of an antenna evaluation apparatus according to a first modified embodiment of the second embodiment of the present invention.

FIG. 11 is a block diagram showing a configuration of an antenna evaluation apparatus according to a first modified embodiment of the second embodiment of the present invention. As described above, when it is assumed that incoming waves for different clusters travel different propagation paths, a plurality of incoming waves included in a cluster are considered to have the same delay time. Therefore, the antenna evaluation apparatus of the present modified embodiment is characterized by including one delay circuit for each of a plurality of M clusters C-1, C-2, . . . , C-M to be created.

In the antenna evaluation apparatus of FIG. 11, a plurality of scatterer antennas make M sets of scatterer antennas 21C-1 to 21C-M, each set of scatterer antennas being associated with one of the M clusters C-1, C-2, . . . , C-M, and each set of scatterer antennas being provided close together in one of M directions toward receiving antennas 22a and 22b. Each set of scatterer antennas may include any number of scatterer antennas, but in the following explanation, each set includes N scatterer antennas. Radio frequency signals generated by respective signal generators 11a and 11b are temporarily combined with each other by a combiner 81, and then the combined signal is divided into M signals by a divider 82 in accordance with the number of clusters. The divider 82 is followed by delay circuits 83-1 to 83-M (collectively indicated by reference numeral "83"). The delay circuits 83-1 to 83-M add to corresponding divided radio frequency signals, given delay times independent from each other and corresponding to different clusters to be created. The delay circuit 83-1 associated with the first cluster C-1 is followed by a divider 84-1. The divider 84-1 divides a radio frequency signal inputted from the delay circuit 83-1 into N radio frequency signals, in accordance with the number of scatterer antennas 21-1-1 to 21-1-N included in the set of scatterer antennas 21C-1. The divider 84-1 is followed by a phase-shift circuit 85-1 including phase shifters 85-1-1 to 85-1-N and an attenuation circuit 86-1 including attenuators 86-1-1 to 86-1-N. The phase shifters 85-1-1 to 85-1-N and the attenuators 86-1-1 to 86-1-N adjust the phases and amplitudes of the corresponding divided radio frequency signals. The adjusted radio frequency signals are radiated from the corresponding scatterer antennas 21-1-1 to 21-1-N. For the rest, likewise, the delay circuits 83-2, 83-3, . . . , 83-M associated with the second, third, . . . , M-th clusters C-2, C-3, . . . , C-M, respectively, are followed by dividers 84-2, 84-3, . . . , 84-M, phase-shift circuits 85-2, 85-3, . . . , 85-M, and attenuation circuits 86-2, 86-3, . . . , 86-M associated with the second, third, . . . , M-th clusters C-2, C-3, . . . , C-M, respectively. A computer 10 controls the delay times of the delay circuits 83-1 to 83-M and controls the amounts of phase adjustment by the phase-shift circuits 85-1 to 85-M and the amounts of amplitude adjustment by the attenuation circuits 86-1 to 86-M through D/A converters 87-1 to 87-M.

Figure 12:
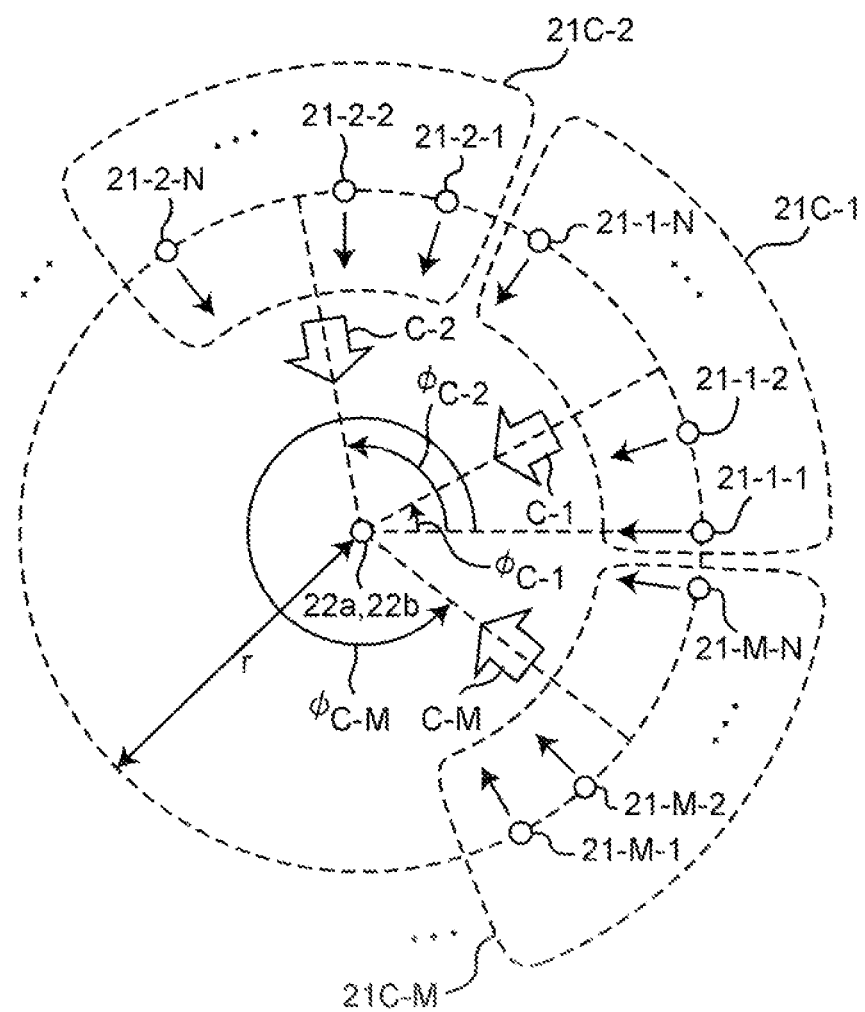
FIG. 12 is a plan view showing an arrangement of antennas for the antenna evaluation apparatus of FIG. 11 and showing clusters of incoming waves C-1, C-2, . . . , C-M.

FIG. 12 is a plan view showing an arrangement of antennas for the antenna evaluation apparatus of FIG. 11 and the clusters of incoming waves C-1, C-2, . . . , C-M. The first set of scatterer antennas 21C-1 includes N scatterer antennas 21-1-1 to 21-1-N provided close together in an angular direction. Radio frequency signals radiated from the scatterer antennas 21-1-1 to 21-1-N create a cluster C-1 having a mean angle of arrival $\phi_{C-1}$ as a whole. Likewise, radio waves radiated from other sets of scatterer antennas 21C-2, . . . , 21C-M also create clusters C-2, . . . , C-M having mean angles of arrival $\phi_{C-2}, \ldots, \phi_{C-M}$.

Thus, the antenna evaluation apparatus of the present modified embodiment can create the clusters of incoming waves around the receiving antennas 22a and 22b by radiating each of M radio frequency signals divided by the divider 82 using the scatterer antennas included in one set of the sets of scatterer antennas 21C-1 to 21C-M. In this case, the computer 10 controls the delay circuits 83-1 to 83-M to add given delay times independent from each other to the M radio frequency signals divided by the divider 82, and controls the phase-shift circuit 85-1 and the attenuation circuit 86-1 to change the phases and amplitudes of the radio frequency signals divided by the divider 84-1 so as to produce a fading, and similarly, the computer 10 controls the phase-shift circuits 85-2 to 85-M and the attenuation circuits 86-2 to 86-M. As described above, according to the antenna evaluation apparatus of the present modified embodiment, when evaluating the performance of receiving antennas of a MIMO wireless communication system, it is possible to create a multipath propagation environment having different angles of arrival for different clusters (spatial clusters) and having different delay times for different clusters (temporal clusters), under an assumption that incoming waves for different clusters travel different propagation paths.

The antenna evaluation apparatus of the present modified embodiment is provided with the delay circuits each corresponding to one of the clusters under the assumption that a plurality of incoming waves included in a cluster have the same delay time, instead of being provided with the delay circuits each corresponding to one of the scatterer antennas as shown in the configuration of FIG. 9. Accordingly, it is possible to reduce the number of the delay circuits as compared to the configuration of FIG. 9, thus simplifying the configuration of the antenna evaluation apparatus.

In the antenna evaluation apparatus according to the present modified embodiment, all the M radio frequency signals outputted from the divider 82 are not necessarily used for creating clusters. A smaller number of clusters than M may be created by attenuating any of the radio frequency signals using the corresponding attenuation circuit. In addition, although FIGS. 11 and 12 show the case in which all the sets of scatterer antennas 21C-1 to 21C-M include the same number (N) of the scatterer antennas, the antenna evaluation apparatus may be configured such that different sets of scatterer antennas include different numbers of scatterer antennas.

Figure 13:
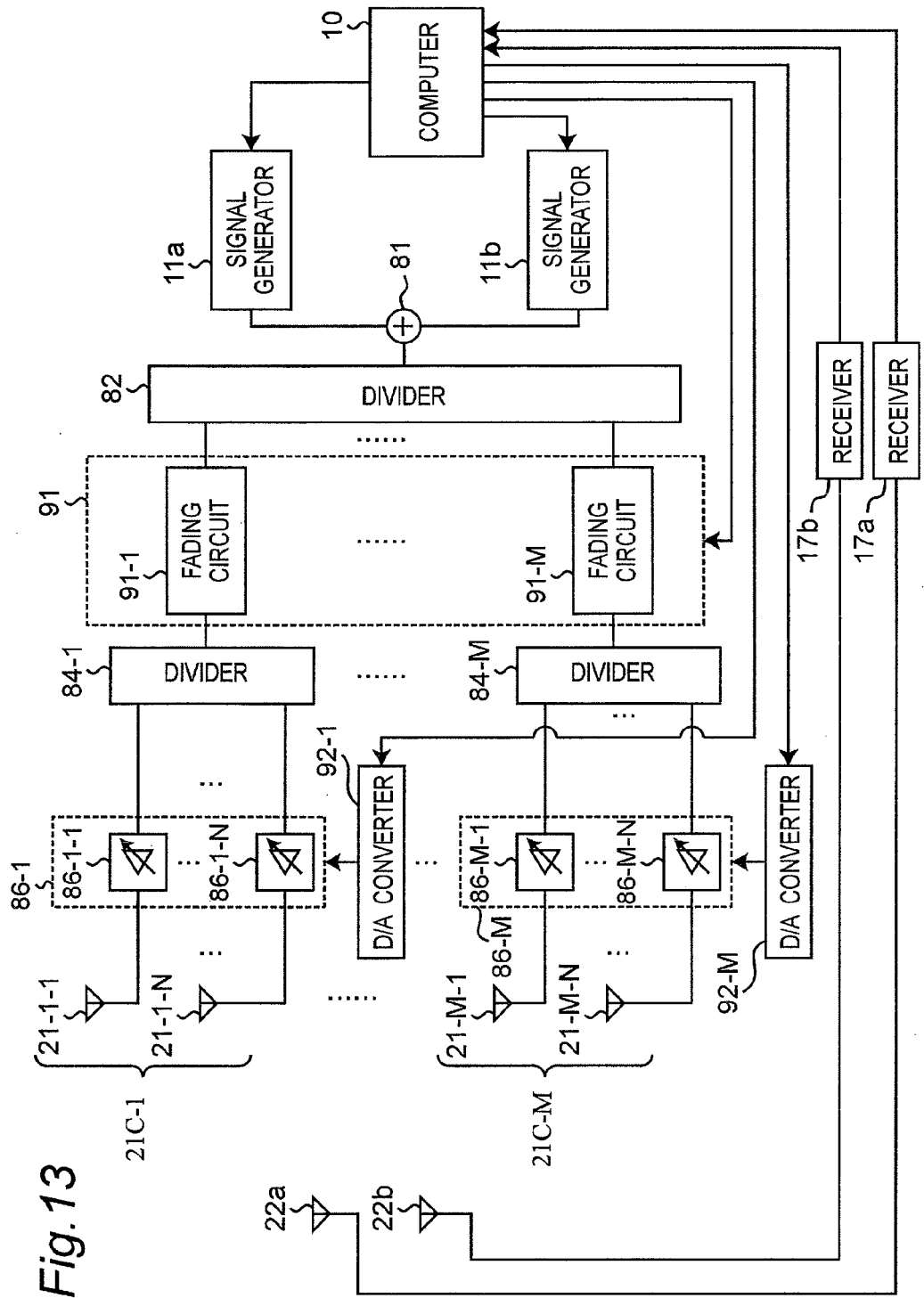
FIG. 13 is a block diagram showing a configuration of an antenna evaluation apparatus according to a second modified embodiment of the second embodiment of the present invention.

FIG. 13 is a block diagram showing a configuration of an antenna evaluation apparatus according to a second modified embodiment of the second embodiment of the present invention. If radio waves arrives with small angular spreads as in the present embodiment, the phases may be adjusted for every cluster, instead of being adjusted for every scatter antenna, for producing fadings. Thus, the number of the phase shifters can be reduced. The antenna evaluation apparatus of the present modified embodiment is characterized in that the phase-shift circuits 85-1 to 85-M in the configuration of FIG. 11 are removed and the delay circuits 83-1 to 83-M of FIG. 11 are replaced by fading circuits 91-1 to 91-M (collectively indicated by reference numeral "91").

The fading circuits 91-1 to 91-M have at least the functions of the delay circuits 83-1 to 83-M and the phase-shift circuits 85-1 to 85-M in the configuration of FIG. 11. The fading circuits 91-1 to 91-M add to M radio frequency signals outputted from a divider 82, given delay times independent from each other and given amounts of phase adjustment independent from each other, and output the resulting radio frequency signals. Under the control of a computer 10, the fading circuits 91-1 to 91-M virtually set conditions such as the directivities of receiving antennas 22a and 22b, information on incoming waves, a moving speed, etc., and output signals which are expected to be received when the receiving antennas 22a and 22b are moving. The output signals include variations over time, corresponding to a fading. Thus, the fading circuits 91-1 to 91-M can virtually produce the fading occurring by the movement of the receiving antennas 22a and 22b.

In a real wireless communication environment, when a receiving antenna moves in a direction $\phi_0$ and a radio wave arrives at the receiving antenna from a direction $\theta$, the radio wave is subjected to a Doppler shift of $\cos(\theta_0-\theta)$. That is, the Doppler shift changes depending on the angle of arrival of the radio wave. Therefore, when radio waves arrive via multipath, a fading occurs by the superposition of a plurality of incoming waves having subjected to various Doppler shifts. The principle on which this fading occurs is identical to the principle for producing a fading using the phase shifters. On the other hand, the fading of the present modified embodiment is produced only by outputting from the fading circuits 91-1 to 91-M the signals with variations over time added in advance, and thus, it is not possible to take into account the Doppler shift depending on the angle of arrival of a radio wave. Accordingly, the principle for producing the fading of the present modified embodiment is different from that of the real wireless communication environment. However, when radio waves arrive as clusters as in the present embodiment, the angles of arrival of the radio waves are limited to a narrow range, and thus, the influence of ignorance of the Doppler shift depending on the angle of arrival of a radio wave is sufficiently small.

The fading circuits 91-1 to 91-M may be configured based on, for example, a fading simulator such as that disclosed in Patent Literature 2. Patent Literature 2 discloses a fading simulator using a three-dimensional model and capable of representing the Rayleigh fading with spatial spread (an apparatus which is used between a transmitter and a receiver connected via cables and creates simulated spatio-temporal characteristics of the actual communication environment). In the following explanation, it is assumed that the fading circuits 91-1 to 91-M are configured based on the fading simulator disclosed in Patent Literature 2.

Figure 14:
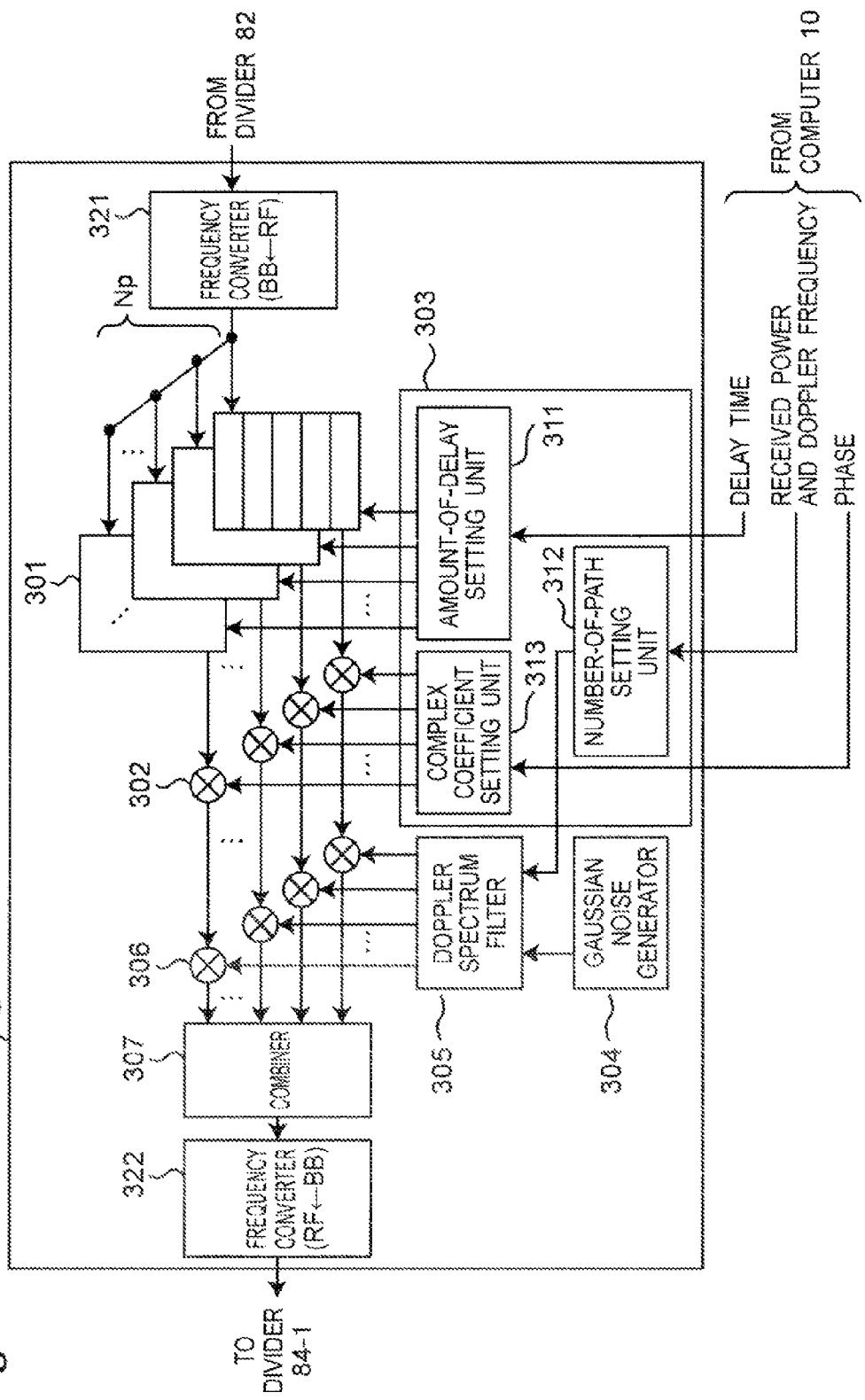
FIG. 14 is a block diagram showing a detailed configuration of a fading circuit 91-1 of FIG. 13.

FIG. 14 is a block diagram showing a detailed configuration of the fading circuit 91-1 of FIG. 13. The fading circuit 91-1 is mainly provided with: FIFO memories 301, complex multipliers 302, a DSP 303, a Gaussian noise generator 304, a Doppler spectrum filter 305, complex multipliers 306, and a combiner 307. The fading circuit 91-1 operates in a baseband, and thus, is further provided with frequency converters 321 and 322 which are similar to the frequency converters 12aa and 12ac of FIG. 2. A radio frequency signal inputted from the divider 82 is firstly converted from a radio frequency (RF) to a baseband frequency (BB) by the frequency converter 321, and the baseband radio frequency signal is sent to the FIFO memories 301. The FIFO memories 301 are provided as many as the maximum number of paths Np. The FIFO memories 301 delay input signals, by amounts of delay controlled by the DSP 303. The complex multipliers 302 are provided as many as the maximum number of paths Np. The complex multipliers 302 multiply input signals delayed by the FIFO memories 301, by complex coefficients controlled by the DSP 303. The DSP 303 includes an amount-of-delay setting unit 311, a number-of-path setting unit 312, and a complex coefficient setting unit 313. The amount-of-delay setting unit 311 sets the amounts of delay of the FIFO memories 301 according to delay time parameter. The number-of-path setting unit 312 distinguishes radio waves using a plurality of paths for representing the Rayleigh fading (referred to as "first radio waves" hereinafter), and radio waves using the Doppler spectrum filter 305 for representing the Rayleigh fading (referred to as "second radio waves" hereinafter), based on the magnitudes of the received powers of the radio waves, and sets the number of paths to be assigned to the first radio waves. In addition, the number-of-path setting unit 312 outputs the maximum Doppler frequency for the second radio waves, to the Doppler spectrum filter 305. The complex coefficient setting unit 313 sets the complex coefficients of the complex multipliers 302 for the first radio waves, based on parameters of the received power, phase, and Doppler frequency. The Gaussian noise generator 304 generates Gaussian noise and outputs the Gaussian noise to the Doppler spectrum filter 305. The Doppler spectrum filter 305 filters the Gaussian noise so as to have spread according to the maximum Doppler frequency. The complex multipliers 306 are provided as many as the maximum number of paths Np. The complex multipliers 306 multiply corresponding output signals from the respective complex multipliers 302, by complex coefficients obtained by filtering using the Doppler spectrum filter 305. The combiner 307 combines output signals from the respective complex multipliers 306. The combined signal is converted from the baseband frequency (BB) to the radio frequency (RF) by the frequency converter 322, and the radio frequency signal is sent to a divider 84-1. Accordingly, it is possible to convert an input signal to a multipath signal, and perform phase rotation and level control on each path, thus creating simulated spatio-temporal characteristics of the actual communication environment. Other fading circuits 91-2, . . . , 91-M are also configured in the same manner as that of the fading circuit 91-1.

The fading circuits 91-1 to 91-M produce variations in received power over the time axis at a certain frequency due to movement of the receiving antennas 22a and 22b (referred to as a "narrow-band fading"), and further produce variations over the frequency axis due to differences among propagation paths of incoming waves and thus due to their delays (referred to as a "wide-band fading").

The antenna evaluation apparatus of the present modified embodiment can create clusters of incoming waves around the receiving antennas 22a and 22b by radiating each of the M radio frequency signals divided by the divider 82 using the scatterer antennas included in one set of the sets of scatterer antennas 21C-1 to 21C-M. In this case, the computer 10 controls the fading circuits 91-1 to 91-M to add to the M radio frequency signals divided by the divider 82, given delay times independent from each other and given amounts of phase adjustment independent from each other, and further controls attenuation circuits 86-1 to 86-M. As described above, according to the antenna evaluation apparatus of the present modified embodiment, when evaluating the performance of receiving antennas of a MIMO wireless communication system, it is possible to create a multipath propagation environment having different angles of arrival for different clusters (spatial clusters) and having different delay times for different clusters (temporal clusters), under an assumption that incoming waves for different clusters travel different propagation paths.

Third Embodiment

Figure 16:
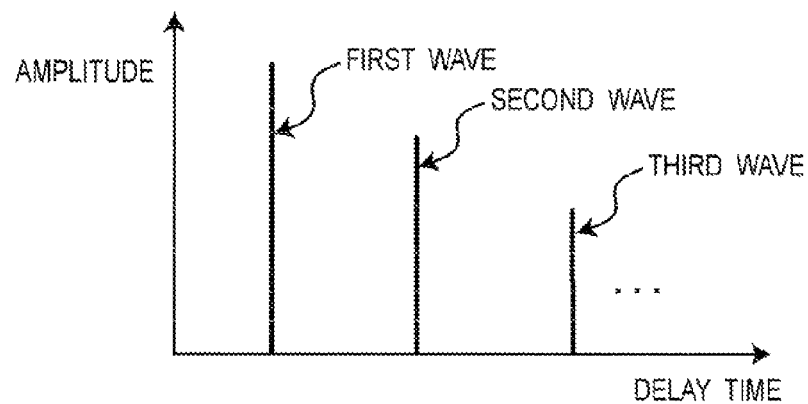
FIG. 16 is a schematic diagram illustrating the presence of a plurality of delayed waves.
Figure 17:
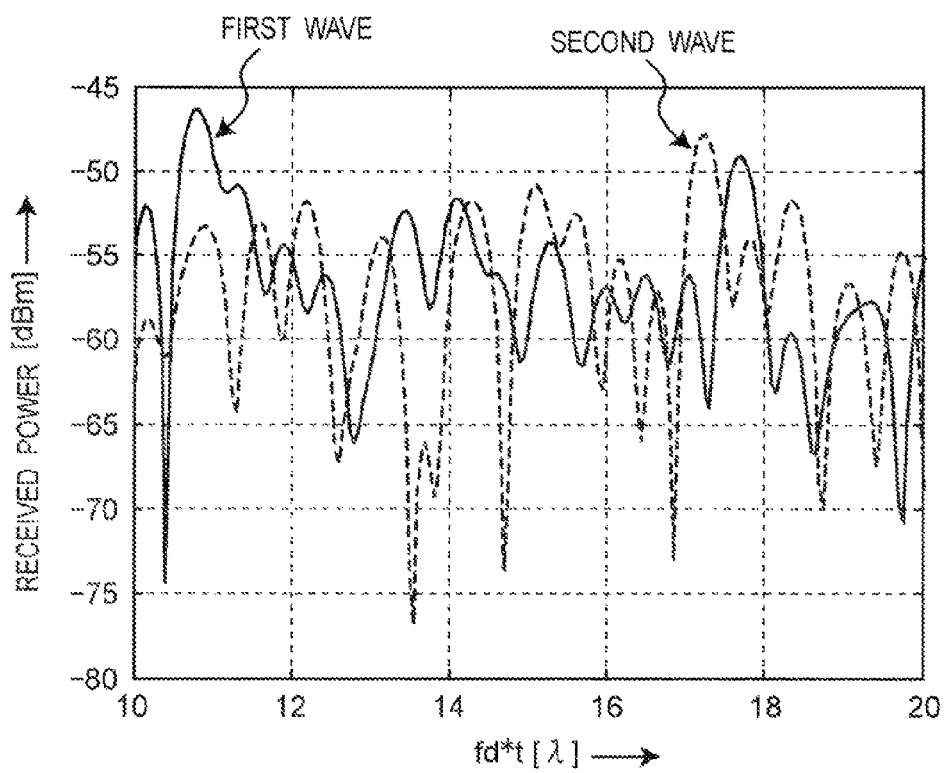
FIG. 17 is a graph showing a state in which a first wave and a second wave of FIG. 16 include different fadings.

As described in the "Background Art" section, SCME defines a model including a plurality of delayed waves. In this case, different delayed waves need to produce different fadings, preferably, fadings having no correlation with each other. FIG. 16 is a schematic diagram illustrating the presence of a plurality of delayed waves. FIG. 17 is a graph showing a state in which a first wave and a second wave of FIG. 16 include different fadings. Therefore, an antenna evaluation apparatus of the present embodiment creates a multipath propagation environment including a plurality of delayed waves, and further produces different fadings for different delayed waves.

Figure 15:
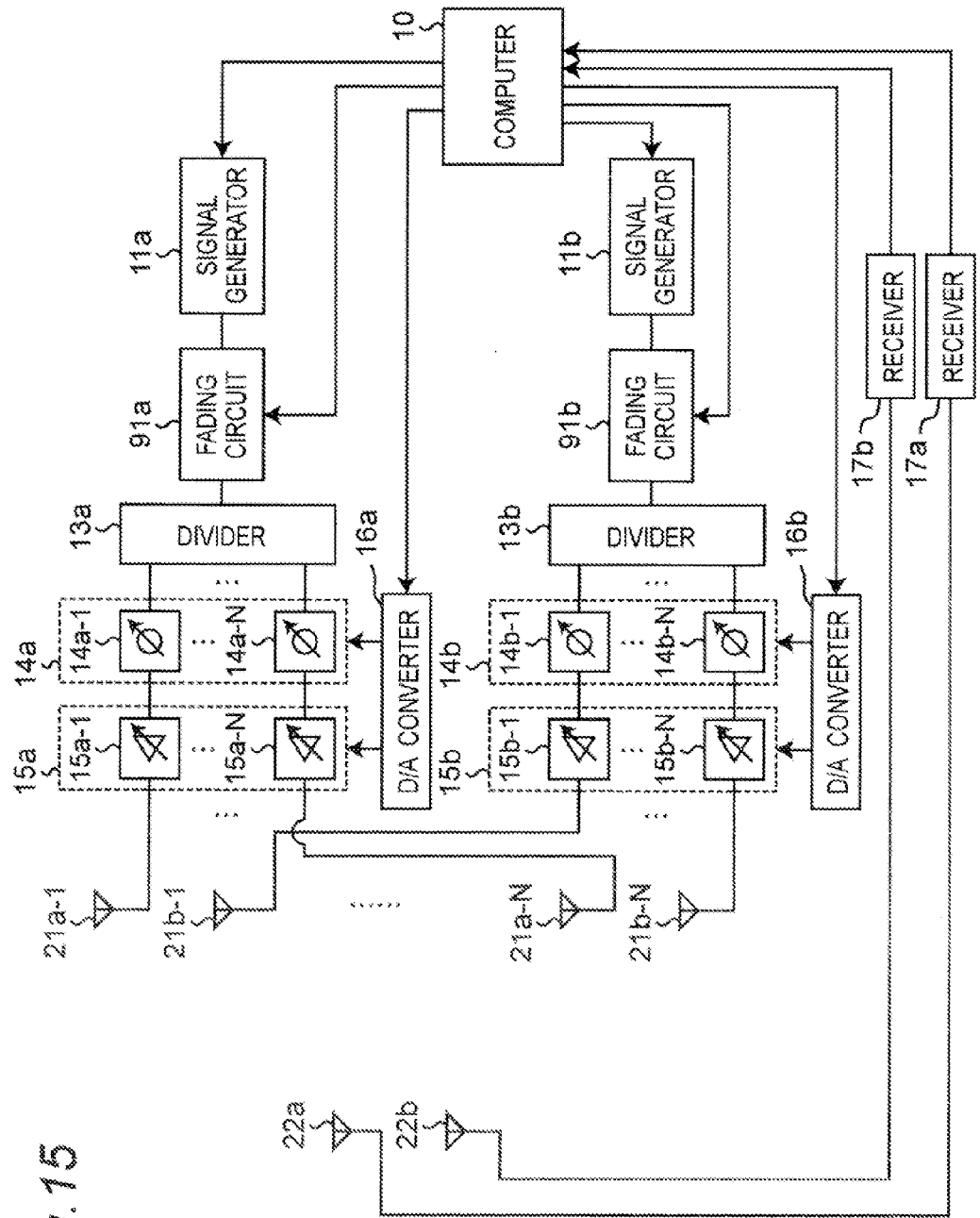
FIG. 15 is a block diagram showing a configuration of an antenna evaluation apparatus according to a third embodiment of the present invention.

FIG. 15 is a block diagram showing a configuration of the antenna evaluation apparatus according to a third embodiment of the present invention. The antenna evaluation apparatus of the present embodiment is characterized by having the same configuration as that of the antenna evaluation apparatus of FIG. 1, and further being provided with, instead of delay circuits 12a and 12b, fading circuits 91a and 91b configured in the same manner as that of the fading circuit 91-1 of FIG. 14. The fading circuit 91a can generate at least one delayed wave from an inputted radio frequency signal, and add fadings having arbitrary correlation with each other to the inputted radio frequency signal and to each delayed radio frequency signal, respectively, or preferably, add fadings having no correlation with each other to the signals, respectively. The fading circuit 91b also operates in the same manner as that of the fading circuit 91a. In order to produce fadings, the antenna evaluation apparatus of the present embodiment uses a combination of fadings produced by phase-shift circuits 14a and 14b and attenuation circuits 15a and 15b (i.e., fadings produced by radio frequency analog circuits) and fadings produced by the fading circuits 91a and 91b (i.e., fadings produced by baseband digital circuits or analog circuits).

Under the control of a computer 10, The fading circuit 91a generates a plurality of delayed waves from a radio frequency signal generated by a signal generator 11a, and adds different fadings to the original radio frequency signal and its delayed waves, respectively. The fadings added by the fading circuit 91a have a common first maximum Doppler frequency $f_{D1}$, and further, are different from each other, or preferably, have no correlation with each other. In general, in order to produce a fading, a method may be used in which random numbers with a complex Gaussian distribution are generated and a frequency band is limited by a frequency filter corresponding to the maximum Doppler frequency. This method is generally implemented by a digital circuit. Meanwhile, a fading signal can also be generated by an analog circuit, and a model for this case will be described below.

An exemplary output signal f(t) from the fading circuit 91a is shown as follows.

$$f(t) = \sum_{k=1}^{K}\sum_{l=1}^{L} \exp[j\{(\omega + 2\pi f_{D1}\cos\psi_{l,k})(t+\tau_l)+\gamma_{l,k}\}] \qquad \text{[Equation 6]}$$

In Equation 6, ω is an angular frequency of a carrier wave. Each "l" (1≤l≤L) corresponds to each different delayed wave, and the number of the delayed waves L is less than or equal to the maximum number of paths Np that can be set by the fading circuit 91a (see FIG. 14). k (1≤k≤K) is the number of signal components used to produce a fading. K is just a arbitrary parameter used for computation in the fading circuit 91a. If an output signal from the fading circuit 91a should include the Rayleigh fading, K is typically set to at least 5, and desirably, set to 7 or more. $\psi_{l,k}$ is a variable for the angle of arrival of a radio wave, which is virtually set in the fading circuit 91a in order to produce a fading. For example, for a given "l", $\psi_{l,1}, \psi_{l,2}, \ldots, \psi_{l,K}$ may be set at intervals of 2π/K, and also for the other "l"s, the angles may be set similarly at even intervals. $\tau_l$ are delay times different from each other, which gradually increase from $\tau_l=0$. $\gamma_{l,k}$ is a given initial phase. In the model of Equation 6, the virtual angle of arrival $\psi_{l,k}$ and initial phase $\gamma_{l,k}$ are different for different delayed waves, but the maximum Doppler frequency $f_{D,1}$ is constant independently of the delayed waves since it is determined by a virtual moving speed of receiving antennas 22a and 22b. Although in Equation 6, the sum of equations including different $\psi_{l,k}$ and $\gamma_{l,k}$ for the different parameter k is computed to produce a fading, the model for producing a fading is not limited to that of Equation 6.

The fading circuit 91a combines the radio frequency signal and its delayed waves, to which fadings are added, respectively, and sends a combined output signal f(t) to a divider 13a. The subsequent processes are the same as those of the antenna evaluation apparatus of FIG. 1. The phase-shift circuit 14a and the attenuation circuit 15a change the phases and amplitudes of the radio frequency signals divided by the divider 13a, to produce a fading. The amount of phase change $p_i(t)$ of Equation 1 is set to each phase shifter 14a-i using, as the maximum Doppler frequency, a second maximum Doppler frequency $f_{D2}$ much higher than the first maximum Doppler frequency $f_{D1}$ (e.g., $f_{D2} \geq 10 \times f_{D1}$). Multipath waves F(t) radiated from scatterer antennas 21a-1 to 21a-N after changing the phase and amplitude of the output signal f(t) from the fading circuit 91a by the phase-shift circuit 14a and the attenuation circuit 15a are shown as follows.

$$F(t) = \sum_{i=1}^{N} [\exp\{j(2\pi f_{D2}\cos(\phi_0 - \phi_i)t + \alpha_i)\} \cdot f(t)] \quad \text{[Equation 7]}$$

$$= f(t) \cdot \sum_{i=1}^{N} \exp\{j(2\pi f_{D2}\cos(\phi_0 - \phi_i)t + \alpha_i)\}$$

When the output signal f(t) from the fading circuit 91a is expressed by Equation 6, Equation 7 is modified as follows.

$$F(t) = \sum_{k=1}^{K}\sum_{l=1}^{L} \exp \quad \text{[Equation 8]}$$

$$[j\{(\omega + 2\pi f_{D1}\cos\psi_{l,k})(t+\tau_l) + \gamma_{l,k}\}] \times$$

$$\sum_{i=1}^{N} \exp\{j(2\pi f_{D2}\cos(\phi_0 - \phi_i)t + \alpha_i)\}$$

$$= \exp(j\omega t) \times \sum_{l=1}^{L} \exp(j\omega\tau_l) \times$$

$$\sum_{k=1}^{K}\sum_{l=1}^{L} \exp[j\{2\pi f_{D1}\cos\psi_{l,k}(t+\tau_l) + \gamma_{l,k}\}] \times$$

$$\sum_{i=1}^{N} \exp\{j(2\pi f_{D2}\cos(\phi_0 - \phi_i)t + \alpha_i)\}$$

As described above, since the second maximum Doppler frequency $f_{D2}$ is much higher than the first maximum Doppler frequency $f_{D1}$, the resultant maximum Doppler frequency of the multipath waves F(t) can be substantially regarded as $f_{D2}$.

The operations of the signal generator 11a, the fading circuit 91a, the divider 13a, the phase-shift circuit 14a, and the attenuation circuit 15a are described above. A signal generator 11b, the fading circuit 91b, a divider 13b, the phase-shift circuit 14b, and the attenuation circuit 15b also operate in the same manner.

As described above, the phase-shift circuits 14a and 14b and the attenuation circuits 15a and 15b virtually produce fadings occurring according to movement of the receiving antennas 22a and 22b (spatial fadings), as in the first embodiment. On the other hand, the fading circuits 91a and 91b generate a plurality of delayed waves and produce different fadings (preferably, fadings having no correlation with each other) for the different delayed waves. Thus, the antenna evaluation apparatus of the present embodiment can produce the spatial fading, and at the same time, generate the plurality of delayed waves and produce the different fadings (preferably, fadings having no correlation with each other) for the different delayed waves.

Figure 18A:
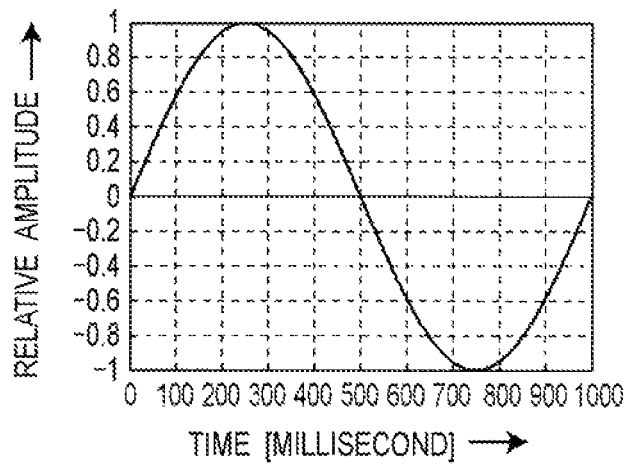
FIG. 18A is a graph showing a first example illustrating the production of fadings, and showing a first fading produced by a fading circuit 91a of FIG. 15.
Figure 18B:
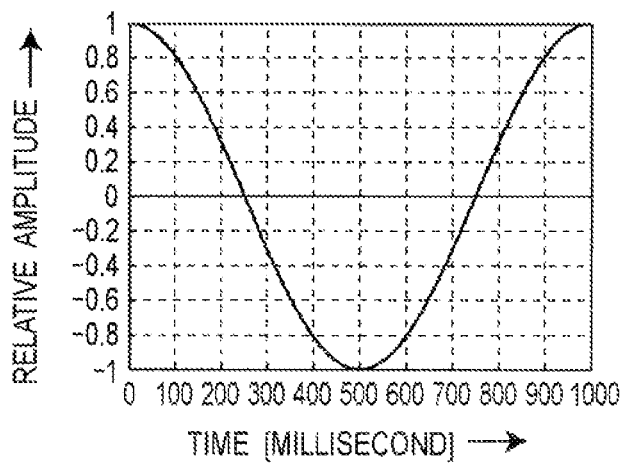
FIG. 18B is a graph showing the first example illustrating the production of fadings, and showing a second fading produced by the fading circuit 91a of FIG. 15.
Figure 18C:
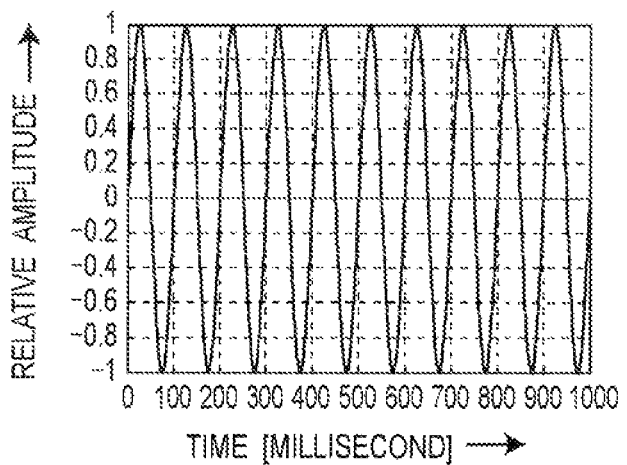
FIG. 18C is a graph showing the first example illustrating the production of fadings, and showing a fading produced by a phase-shift circuit 14a and an attenuation circuit 15a of FIG. 15.
Figure 19A:
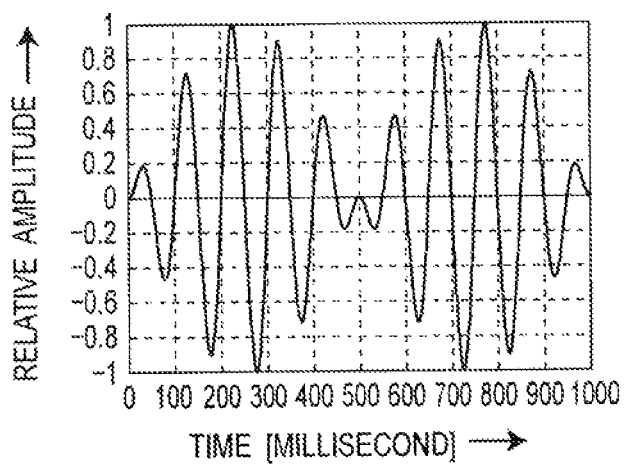
FIG. 19A is a graph showing a fading obtained by combining the fadings shown in FIGS. 18A and 18C.
Figure 19B:
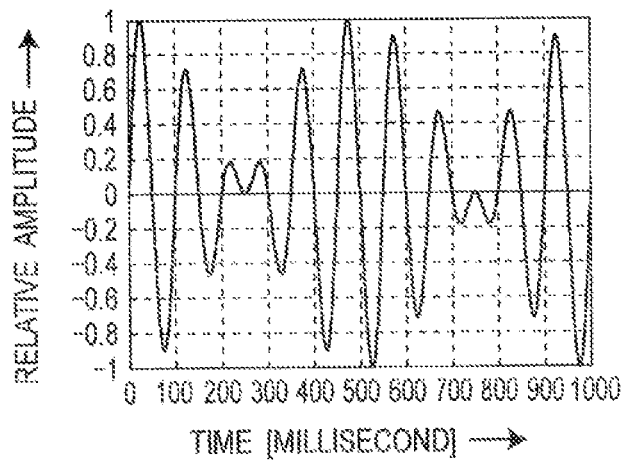
FIG. 19B is a graph showing a fading obtained by combining the fadings shown in FIGS. 18B and 18C.

Next, with reference to exemplary signal waveforms of FIGS. 18A, 18B, 18C, 19A, and 19B, the production of fadings will be described. FIG. 18A is a graph showing a first example illustrating the production of fadings, and showing a first fading produced by the fading circuit 91a of FIG. 15 and included in an output signal from the fading circuit 91a. FIG. 18B is a graph showing the first example illustrating the production of fadings, and showing a second fading produced by the fading circuit 91a of FIG. 15 and included in an output signal from the fading circuit 91a. FIGS. 18A and 18B show the signals having the same maximum Doppler frequency $f_{D1}$=1 Hz and having no correlation with each other. The first fading is added to, for example, a radio frequency signal delayed by a first delay time, and the second fading is added to, for example, a radio frequency signal delayed by a second delay time different from the first delay time. FIG. 18C is a graph showing a fading produced by the phase-shift circuit 14a and the attenuation circuit 15a of FIG. 15, i.e., a fading added by the phase-shift circuit 14a and the attenuation circuit 15a to an output signal from the fading circuit 91a which is sent through the divider 13a. The fading added by the phase-shift circuit 14a and the attenuation circuit 15a has the maximum Doppler frequency $f_{D2}$=10 Hz much higher than the maximum Doppler frequency $f_{D1}$ of the fadings produced by the fading circuit 91a. FIG. 19A is a graph showing a fading obtained by combining the fadings shown in FIGS. 18A and 18C. FIG. 19B is a graph showing a fading obtained by combining the fadings shown in FIGS. 18B and 18C. As shown in FIGS. 19A and 19B, by producing fadings having no correlation with each other by the fading circuits 91a and 91b, it is possible to make the fadings of resultant multipath waves have no correlation with each other. Therefore, for example, it is possible to make the first wave and its delayed waves (the second wave, the third wave, etc.) of FIG. 16 have no correlation with each other.

Figure 20A:
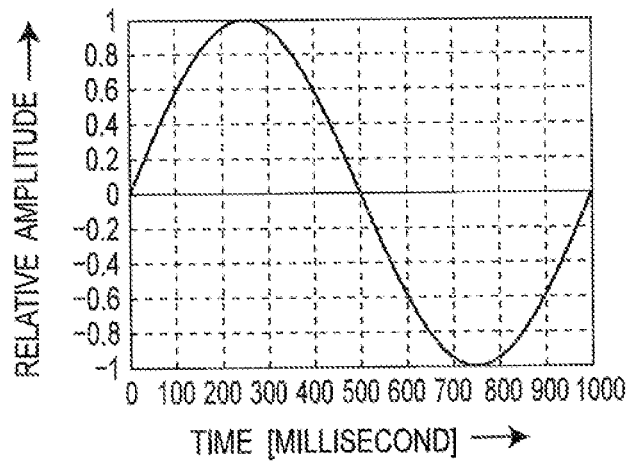
FIG. 20A is a graph showing a second example illustrating the production of fadings, and showing a first fading produced by the fading circuit 91a of FIG. 15.
Figure 20B:
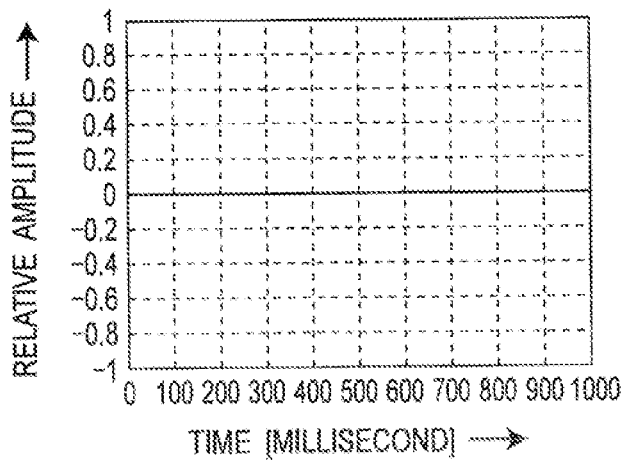
FIG. 20B is a graph showing the second example illustrating the production of fadings, and showing a second fading produced by the fading circuit 91a of FIG. 15.
Figure 20C:
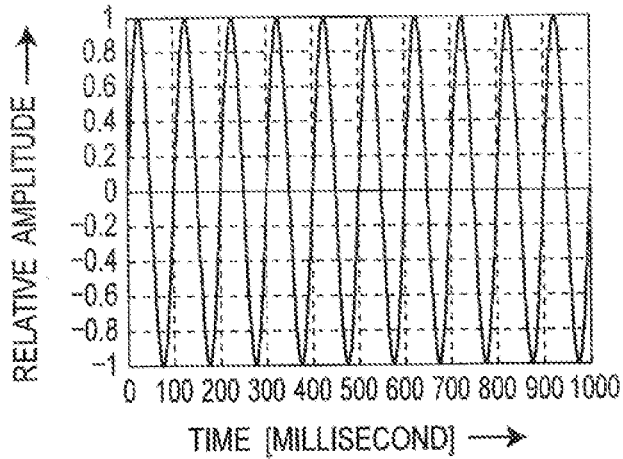
FIG. 20C is a graph showing the second example illustrating the production of fadings, and showing a fading produced by the phase-shift circuit 14a and the attenuation circuit 15a of FIG. 15.
Figure 21A:
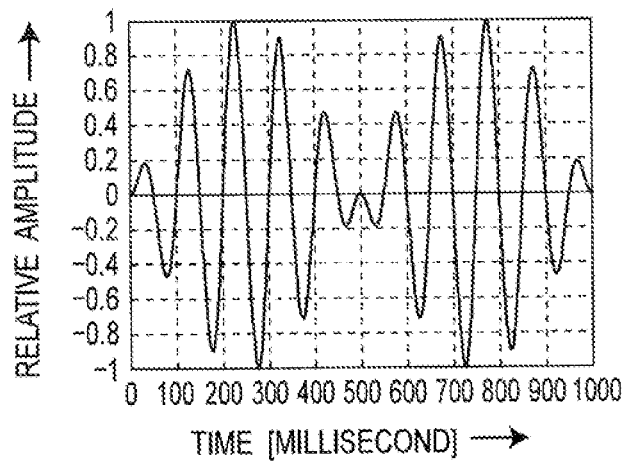
FIG. 21A is a graph showing a fading obtained by combining the fadings shown in FIGS. 20A and 20C.
Figure 21B:
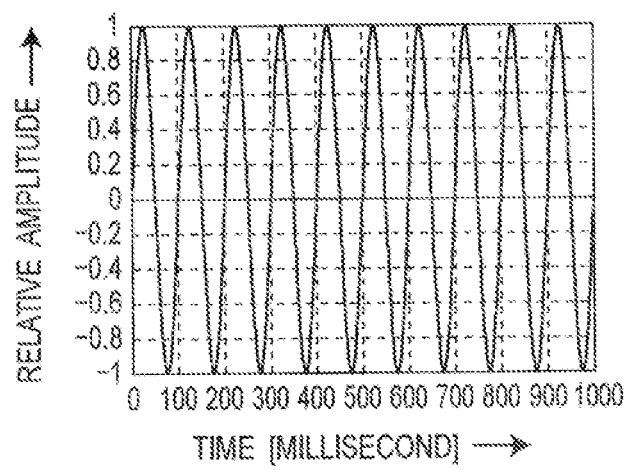
FIG. 21B is a graph showing a fading obtained by combining the fadings shown in FIGS. 20B and 20C.

The output signals from the fading circuit 91a as shown in FIGS. 18A and 18B have the same maximum Doppler frequency, but the output signals are not limited thereto. FIG. 20A is a graph showing a second example illustrating the production of fadings, and showing a first fading produced by the fading circuit 91a of FIG. 15. FIG. 20B is a graph showing the second example illustrating the production of fadings, and showing a second fading produced by the fading circuit 91a of FIG. 15. In this case, only one output signal is added with a fading having the maximum Doppler frequency $f_{D1}$=1 Hz (FIG. 20A), and the other output signal is made constant with an amplitude of 0 (FIG. 20B). FIG. 20C is a graph showing a fading produced by the phase-shift circuit 14a and the attenuation circuit 15a of FIG. 15. The fading shown in FIG. 20C has the same maximum Doppler frequency $f_{D2}$=10 Hz as that of FIG. 18C. FIG. 21A is a graph showing a fading obtained by combining the fadings shown in FIGS. 20A and 20C. FIG. 21B is a graph showing a fading obtained by combining the fadings shown in FIGS. 20B and 20C. As shown in FIGS. 20A and 20B, also by adding a fading to only one output signal and making the other output signal constant, it is possible to make the fadings of resultant multipath waves have no correlation with each other. The fadings of the resultant multipath waves can be made to have no correlation with each other, as long as a plurality of signals generated by the fading circuit 91a are different from each other.

For ease of explanation, FIGS. 18A to 18C and FIGS. 20A to 20C show fadings to be produced, as sine waves. However, fadings having more complex waveforms can also be produced in the same manner.

As described above, the antenna evaluation apparatus of the present embodiment can produce a spatial fading, and at the same time, generate a plurality of delayed waves and produce different fadings (preferably, fadings having no correlation with each other) for the different delayed waves.

Figure 22:
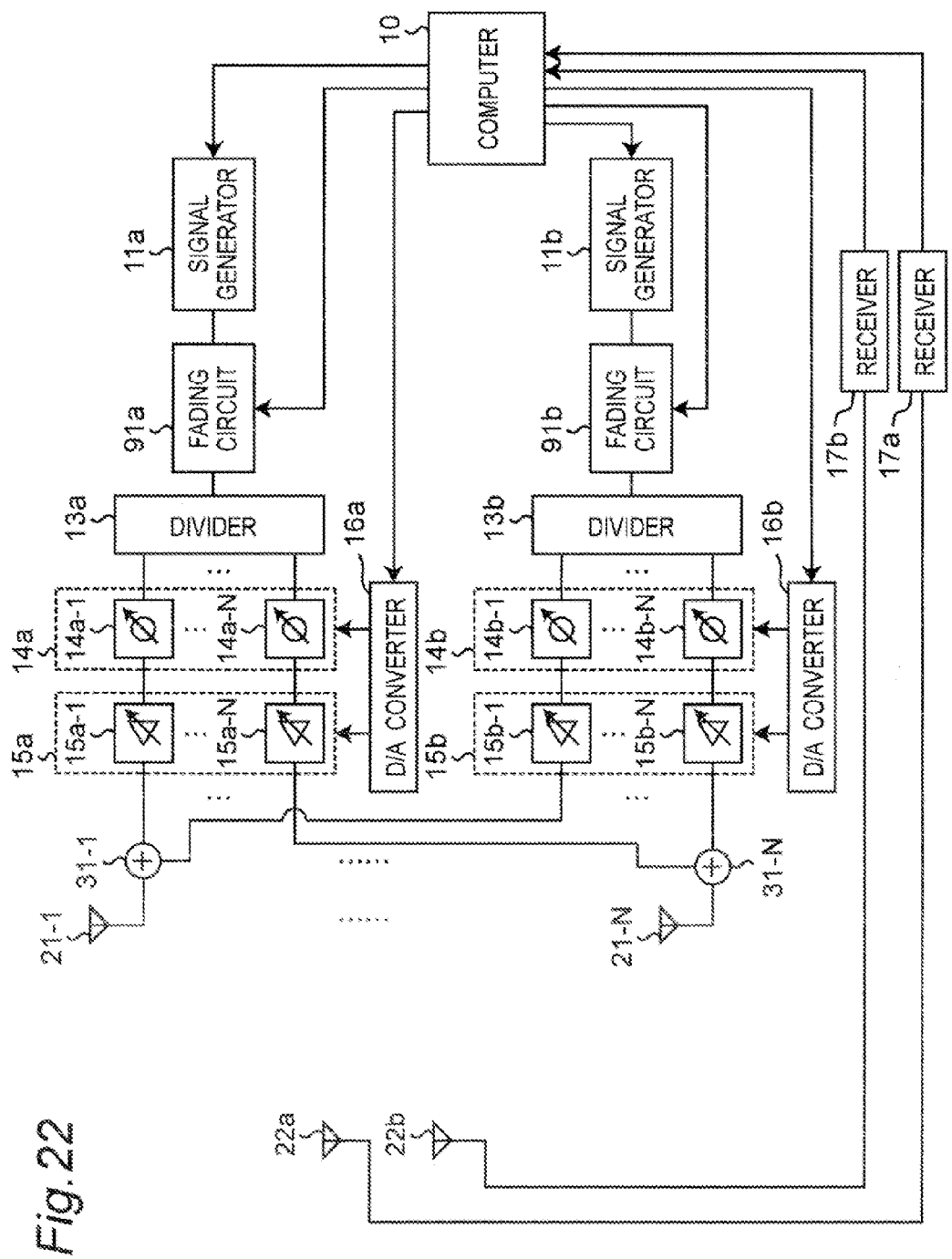
FIG. 22 is a block diagram showing a configuration of an antenna evaluation apparatus according to a first modified embodiment of the third embodiment of the present invention.

FIG. 22 is a block diagram showing a configuration of an antenna evaluation apparatus according to a first modified embodiment of the third embodiment of the present invention. The antenna evaluation apparatus of the present modified embodiment is characterized by having the same configuration as that of the antenna evaluation apparatus of FIG. 4, and further being provided with fading circuits 91a and 91b similar to as that of FIG. 15, instead of the delay circuits 12a and 12b. Accordingly, the antenna evaluation apparatus of the present modified embodiment can reduce the number of scatterer antennas as compared to that of the configuration of FIG. 15, thus simplifying the configuration of the antenna evaluation apparatus.

Figure 23:
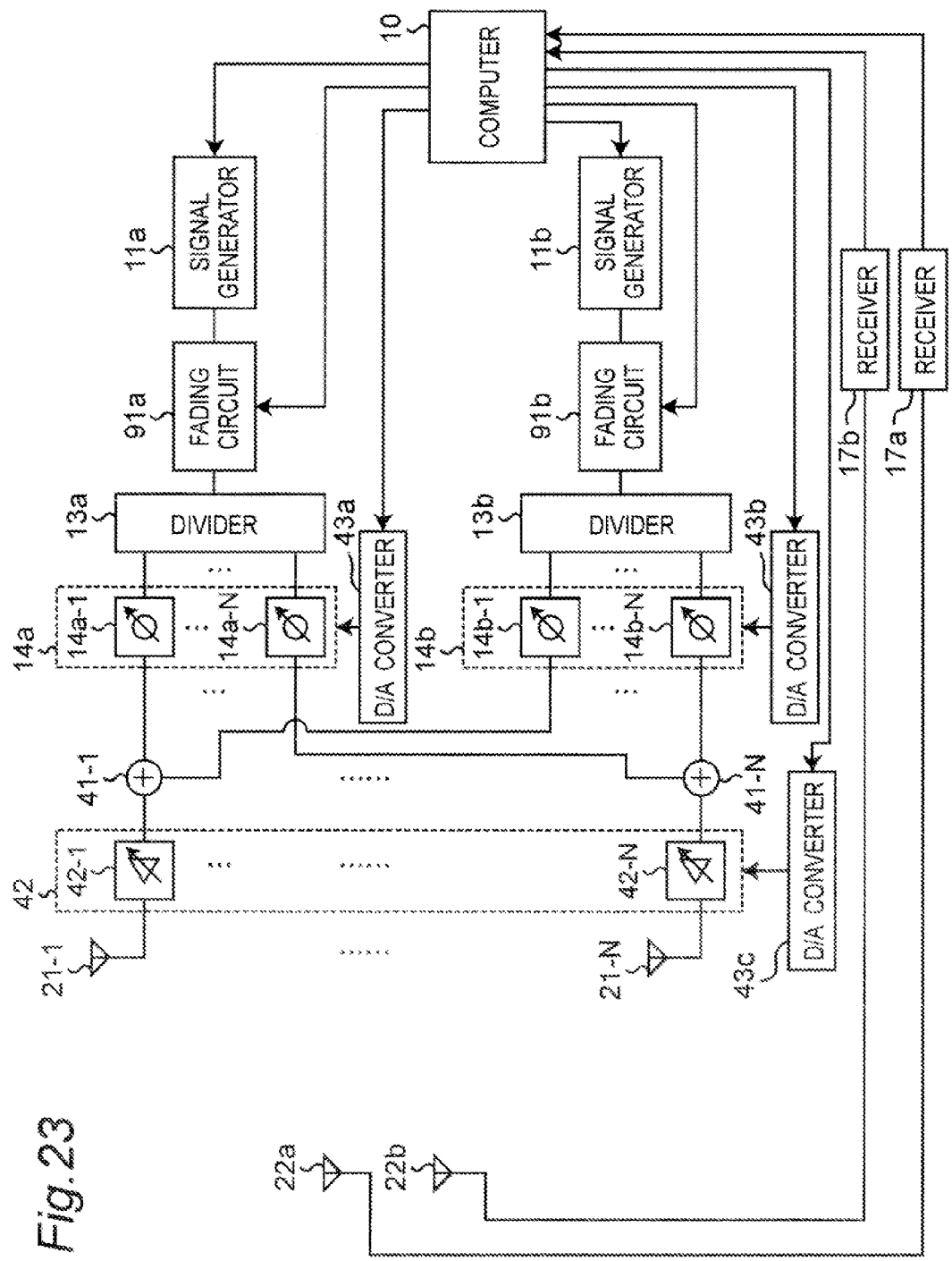
FIG. 23 is a block diagram showing a configuration of an antenna evaluation apparatus according to a second modified embodiment of the third embodiment of the present invention.

FIG. 23 is a block diagram showing a configuration of an antenna evaluation apparatus according to a second modified embodiment of the third embodiment of the present invention. The antenna evaluation apparatus of the present modified embodiment is characterized by having the same configuration as that of the antenna evaluation apparatus of FIG. 6, and further being provided with fading circuits 91a and 91b similar, to as that of FIG. 15, instead of the delay circuits 12a and 12b. Accordingly, the antenna evaluation apparatus of the present modified embodiment can reduce the numbers of scatterer antennas and attenuators as compared to the configuration of FIG. 15, thus simplifying the configuration of the antenna evaluation apparatus.

Figure 24:
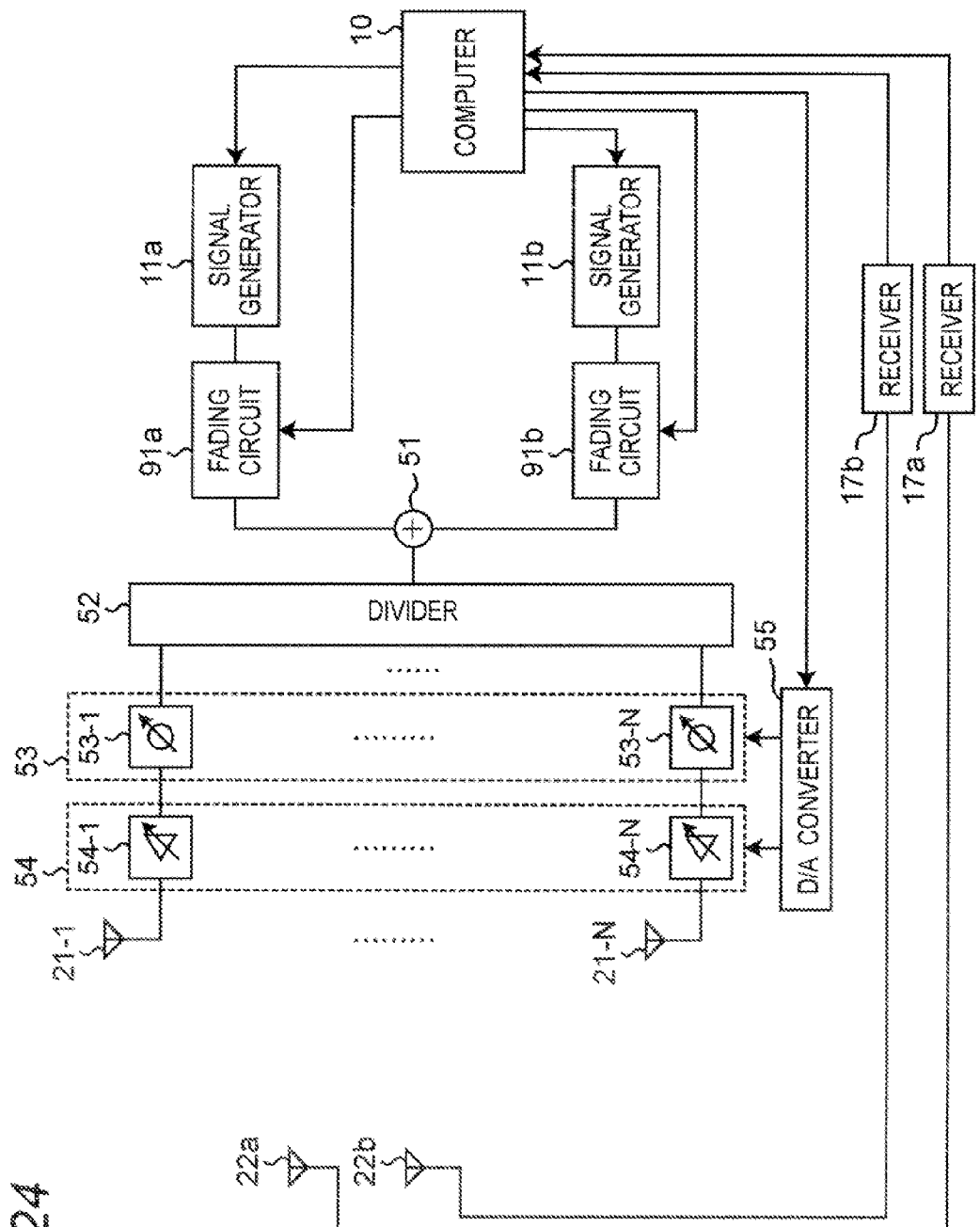
FIG. 24 is a block diagram showing a configuration of an antenna evaluation apparatus according to a third modified embodiment of the third embodiment of the present invention.

FIG. 24 is a block diagram showing a configuration of an antenna evaluation apparatus according to a third modified embodiment of the third embodiment of the present invention. The antenna evaluation apparatus of the present modified embodiment is characterized by having the same configuration as that of the antenna evaluation apparatus of FIG. 7, and further being provided with fading circuits 91a and 91b similar to that of FIG. 15, instead of the delay circuits 12a and 12b. Accordingly, the antenna evaluation apparatus of the present modified embodiment can reduce the numbers of scatterer antennas, attenuators, and phase shifters as compared to the configuration of FIG. 15, thus simplifying the configuration of the antenna evaluation apparatus.

Figure 25:
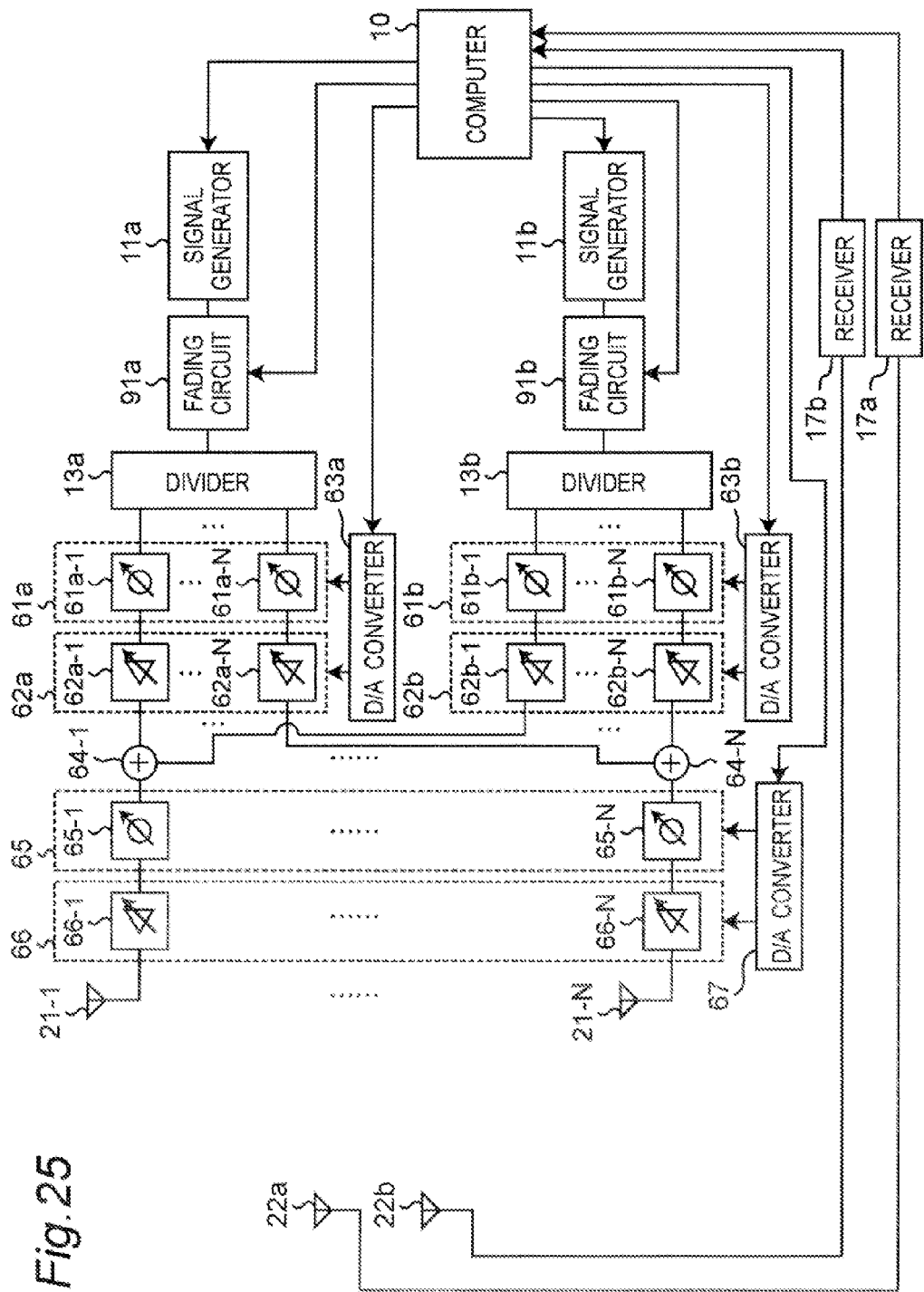
FIG. 25 is a block diagram showing a configuration of an antenna evaluation apparatus according to a fourth modified embodiment of the third embodiment of the present invention.

FIG. 25 is a block diagram showing a configuration of an antenna evaluation apparatus according to a fourth modified embodiment of the third embodiment of the present invention. The antenna evaluation apparatus of the present modified embodiment is characterized by having the same configuration as that of the antenna evaluation apparatus of FIG. 8, and further provided with fading circuits 91a and 91b similar to that of FIG. 15, instead of the delay circuits 12a and 12b. The circuit configuration of the present modified embodiment includes 1.5 times as many phase shifters and attenuators as, for example, the circuit configuration of FIG. 22. However, since only phase shifters 65-1 to 65-N continuously operate over time, the load for the control by a computer 10 is reduced by half. If the antenna evaluation apparatus of the present modified embodiment is to be calibrated for amplitude, it is possible to use an attenuation circuit 66 for producing a fading, which is different from the attenuation circuits 62a and 62b for adjusting distributions of incoming waves. Thus, in the antenna evaluation apparatus, circuit elements for calibration are separated from circuit elements for adjusting distributions of incoming waves.

Modified Embodiments

Figure 26:
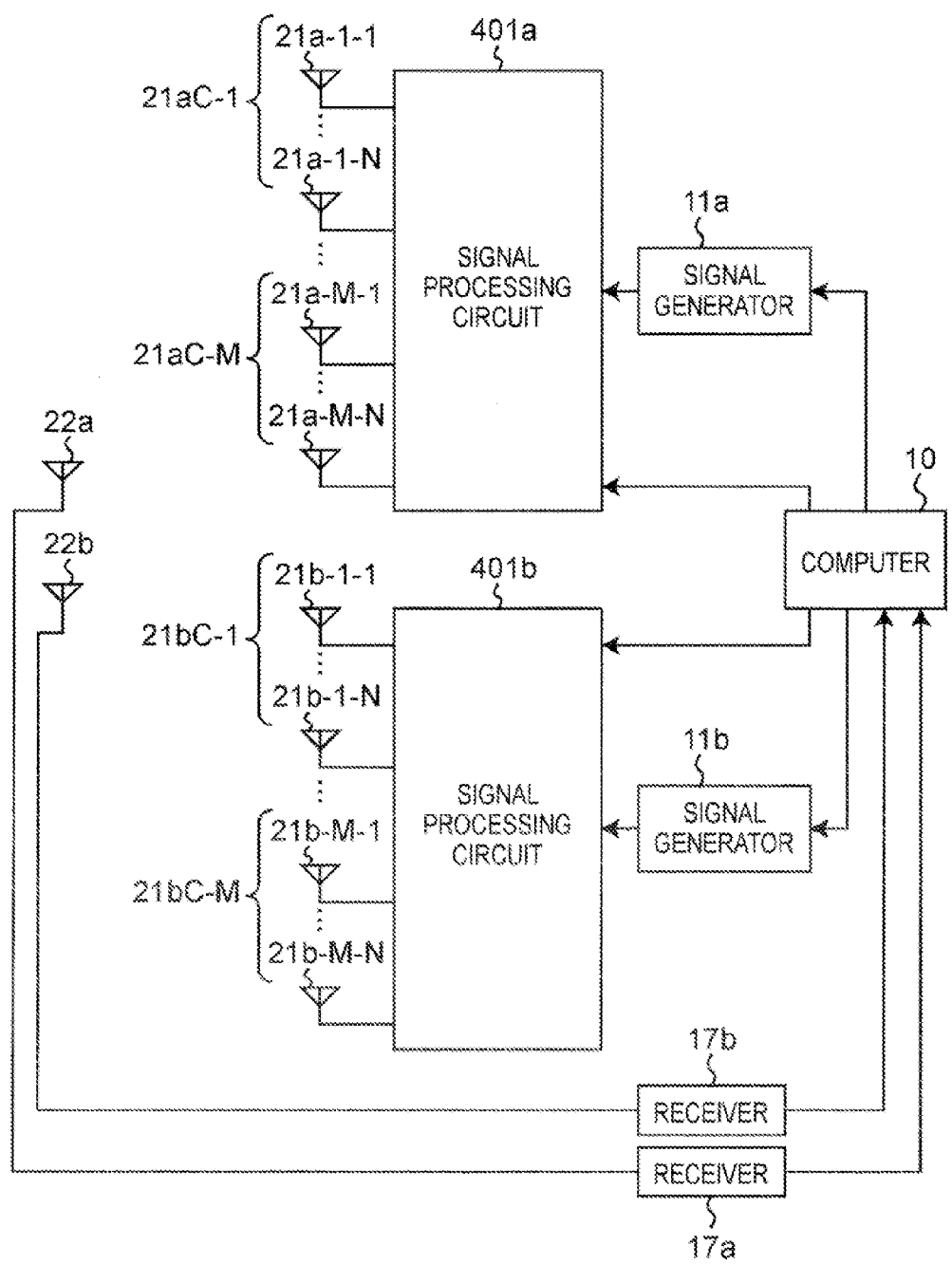
FIG. 26 is a block diagram showing a configuration of an antenna evaluation apparatus according to a third modified embodiment of the second embodiment of the present invention.
Figure 27:
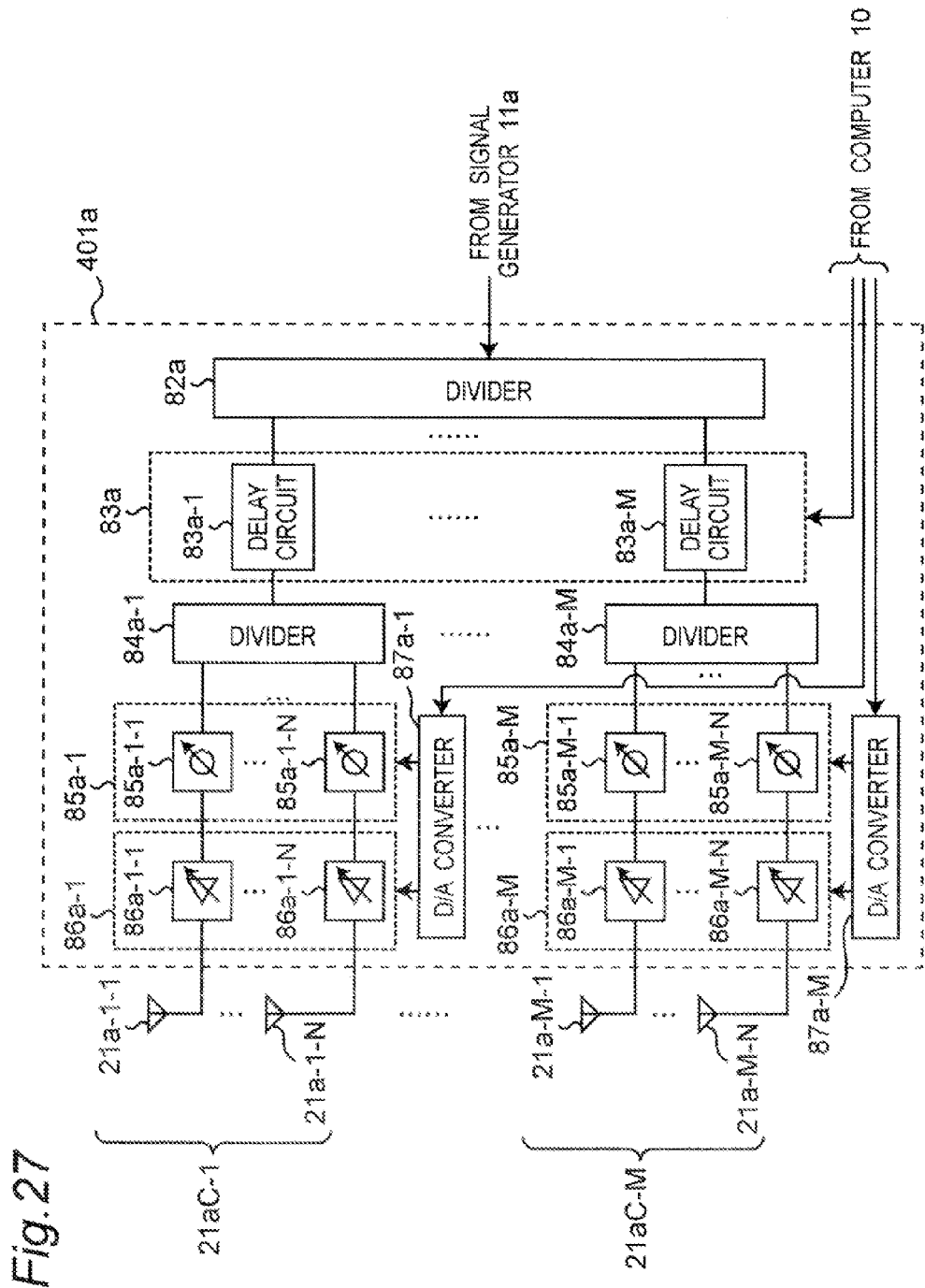
FIG. 27 is a block diagram showing a detailed configuration of a signal processing circuit 401a of FIG. 26.

The above-described embodiments may be combined with each other. FIG. 26 is a block diagram showing a configuration of an antenna evaluation apparatus according to a third modified embodiment of the second embodiment of the present invention. FIG. 27 is a block diagram showing a detailed configuration of a signal processing circuit 401a of FIG. 26. The antenna evaluation apparatus of the present modified embodiment has a configuration in which the first embodiment is combined with the concept of the "clusters" described in the second embodiment.

In FIG. 27, a radio frequency signal generated by a signal generator 11a is divided into M radio frequency signals by a divider 82a in accordance with the number of clusters. The divider 82a is followed by delay circuits 83a-1 to 83a-M (collectively indicated by reference numeral "83a"). The delay circuits 83a-1 to 83a-M add to the corresponding divided radio frequency signals, given delay times independent from each other for different clusters to be created. The delay circuit 83a-1 associated with a first cluster Ca-1 is followed by a divider 84a-1. The divider 84a-1 divides a radio frequency signal inputted from the delay circuit 83a-1 into N radio frequency signals, in accordance with the number of scatterer antennas 21a-1-1 to 21a-1-N included in a set of scatterer antennas 21aC-1. The divider 84a-1 is followed by a phase-shift circuit 85a-1 including phase shifters 85a-1-1 to 85a-1-N and an attenuation circuit 86a-1 including attenuators 86a-1-1 to 86a-1-N. The phase shifters 85a-1-1 to 85a-1-N and the attenuators 86a-1-1 to 86a-1-N adjust the phases and amplitudes of the corresponding divided radio frequency signals. The adjusted radio frequency signals are radiated from the corresponding scatterer antennas 21a-1-1 to 21a-1-N. Similarly, the delay circuits 83a-2, 83a-3, . . . , 83a-M, which are associated with the second, third, . . . , M-th clusters Ca-2, Ca-3, . . . , Ca-M, respectively, are followed by dividers 84a-2, 84a-3, . . . , 84a-M, phase-shift circuits 85a-2, 85a-3, . . . , 85a-M, and attenuation circuits 86a-2, 86a-3, . . . , 86a-M, which are associated with the second, third, . . . , M-th clusters Ca-2, Ca-3, . . . , Ca-M, respectively. A computer 10 controls the delay times of the delay circuits 83a-1 to 83a-M, and controls the amounts of phase adjustment by the phase-shift circuits 85a-1 to 85a-M and the amounts of amplitude adjustment by the attenuation circuits 86a-1 to 86a-M through D/A converters 87a-1 to 87a-M. A radio frequency signal generated by a signal generator 11b is also processed by a signal processing circuit 401b in the same manner, and the processed radio frequency signals are radiated from corresponding scatterer antennas 21b-1-1 to 21b-1-N, . . . , 21b-M-1 to 21b-M-N included in sets of scatterer antennas 21bC-1 to 21bC-M. In addition, receiving antennas 22a and 22b, receivers 17a and 17b, etc., are configured in the same manner as those of the antenna evaluation apparatus of FIG. 1.

Figure 28:
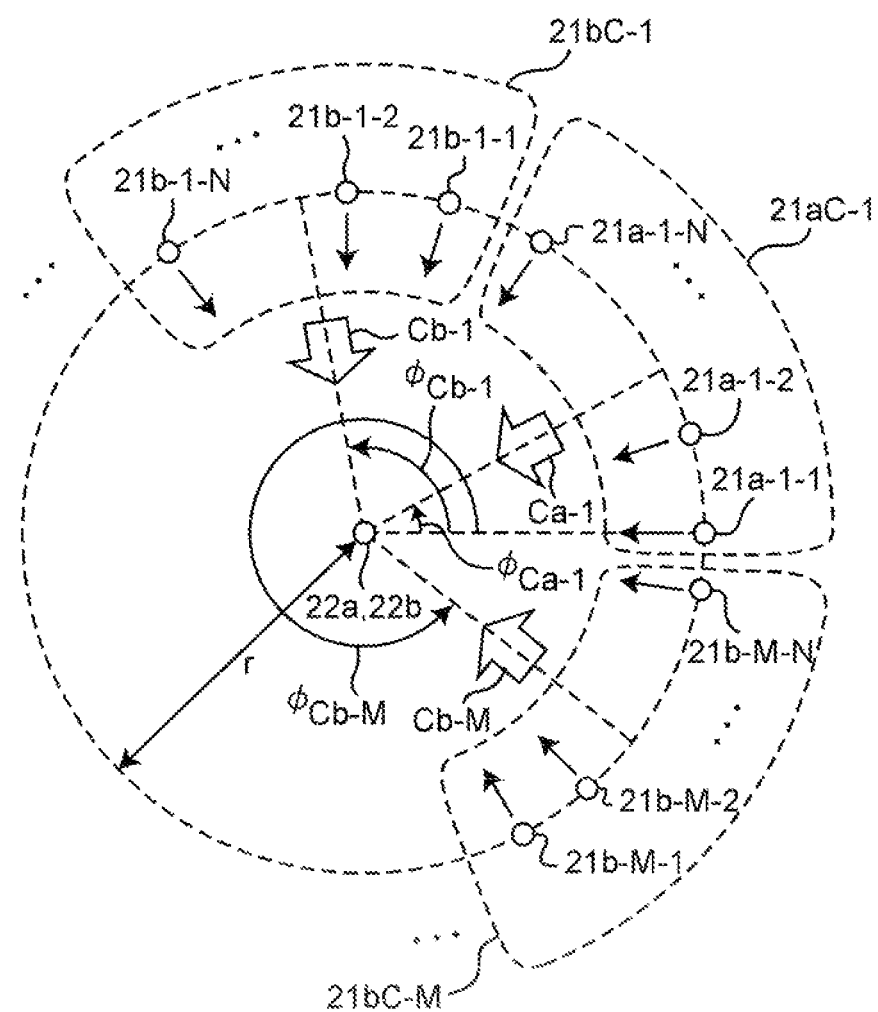
FIG. 28 is a plan view showing an arrangement of antennas for the antenna evaluation apparatus of FIG. 26 and showing clusters of incoming waves Ca-1, Cb-1, . . . , Cb-M.

FIG. 28 is a plan view showing an arrangement of antennas for the antenna evaluation apparatus of FIG. 26 and showing clusters of incoming waves. Ca-1, Cb-1, . . . , Cb-M. The set of scatterer antennas 21aC-1 includes N scatterer antennas 21a-1-1 to 21a-1-N provided close together in an angular direction. Radio frequency signals radiated from the scatterer antennas 21a-1-1 to 21a-1-N create a cluster Ca-1 having a mean angle of arrival $\phi_{Ca\text{-}1}$ as a whole. The set of scatterer antennas 21$b$C-1 includes N scatterer antennas 21$b$-1-1 to 21$b$-1-N provided close together an angular direction. Radio frequency signals radiated from the scatterer antennas 21$b$-1-1 to 21$b$-1-N create a cluster Cb-1 having a mean angle of arrival $\phi_{Cb\text{-}1}$ as a whole. Similarly, radio waves radiated from other sets of scatterer antennas 21$a$C-2, ..., 21$a$C-M and 21$b$C-2, ..., 21$b$C-M also create clusters Ca-2, ..., Ca-M and Cb-2, ..., Cb-M having mean angles of arrival $\phi_{Ca\text{-}2}$, ..., $\phi_{Ca\text{-}M}$ and $\phi_{Cb\text{-}2}$, ..., $\phi_{Cb\text{-}M}$.

Figure 29:
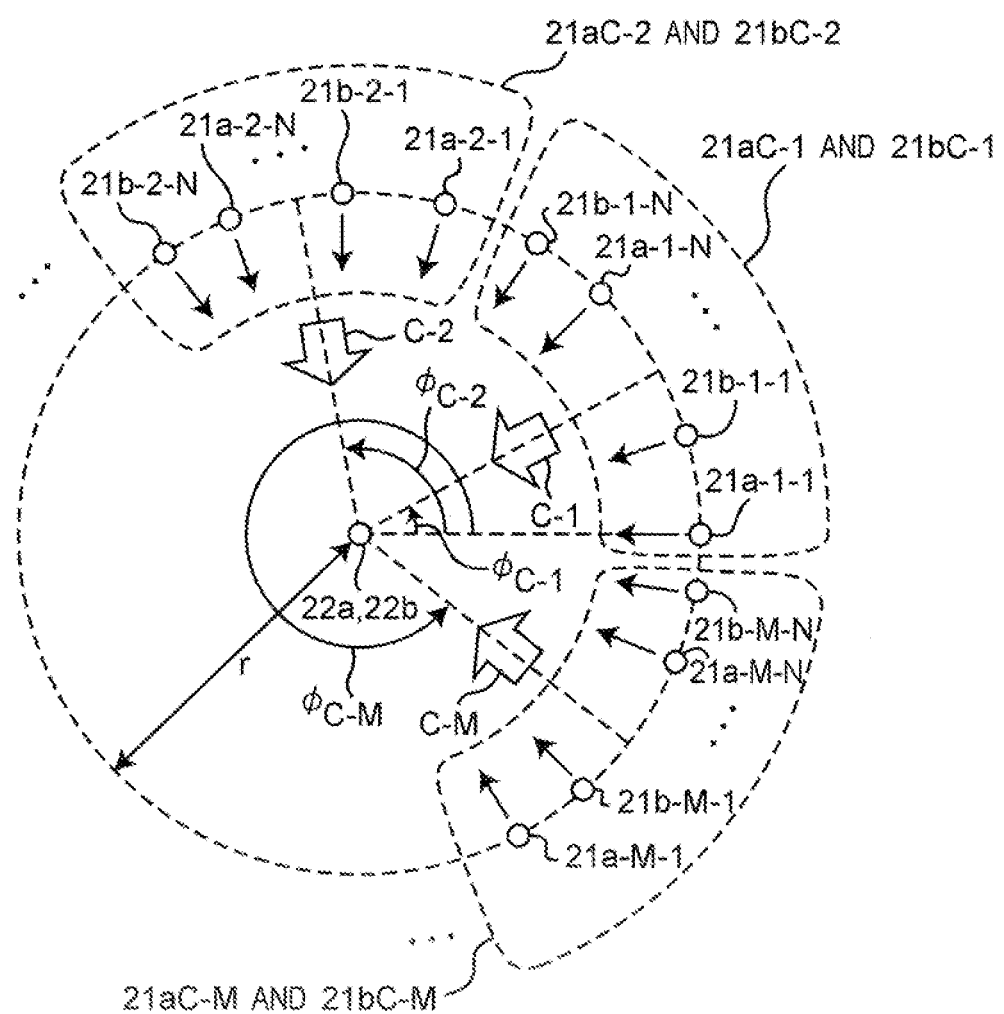
FIG. 29 is a plan view showing a modified embodiment of an arrangement of antennas for the antenna evaluation apparatus of FIG. 26 and showing clusters of incoming waves C-1, C-2, . . . , C-M.

FIG. 29 is a plan view showing a modified embodiment of an arrangement of antennas for the antenna evaluation apparatus of FIG. 26 and showing clusters of incoming waves C-1, C-2, ..., C-M. Different clusters, each radiating radio frequency signals corresponding to a radio frequency signal generated by one of different signal generators, may overlap each other. The sets of scatterer antennas 21$a$C-1 and 21$b$C-1 include 2N scatterer antennas 21$a$-1-1 to 21$a$-1-N and 21$b$-1-1 to 21$b$-1-N provided close together in an angular direction. Radio frequency signals radiated from the scatterer antennas 21$a$-1-1 to 21$a$-1-N and 21$b$-1-1 to 21$b$-1-N create a cluster C-1 having a mean angle of arrival $\phi_{C\text{-}1}$ as a whole. Similarly, radio waves radiated from other sets of scatterer antennas 21$a$C-2 and 21$b$C-2, ..., 21$a$C-M and 21$b$C-M also create clusters C-2, ..., C-M having mean angles of arrival $\phi_{C\text{-}2}$, ..., $\phi_{C\text{-}M}$. It is not necessary that all the clusters overlap each other as shown in FIG. 29, and at least some of the clusters may overlap each other.

According to the antenna evaluation apparatus of the present modified embodiment, when evaluating the performance of receiving antennas of a MIMO wireless communication system, it is possible to create a multipath propagation environment having different angles of arrival for different clusters (spatial clusters) and having different delay times for different clusters (temporal clusters), under an assumption that incoming waves for different clusters travel different propagation paths.

Figure 30:
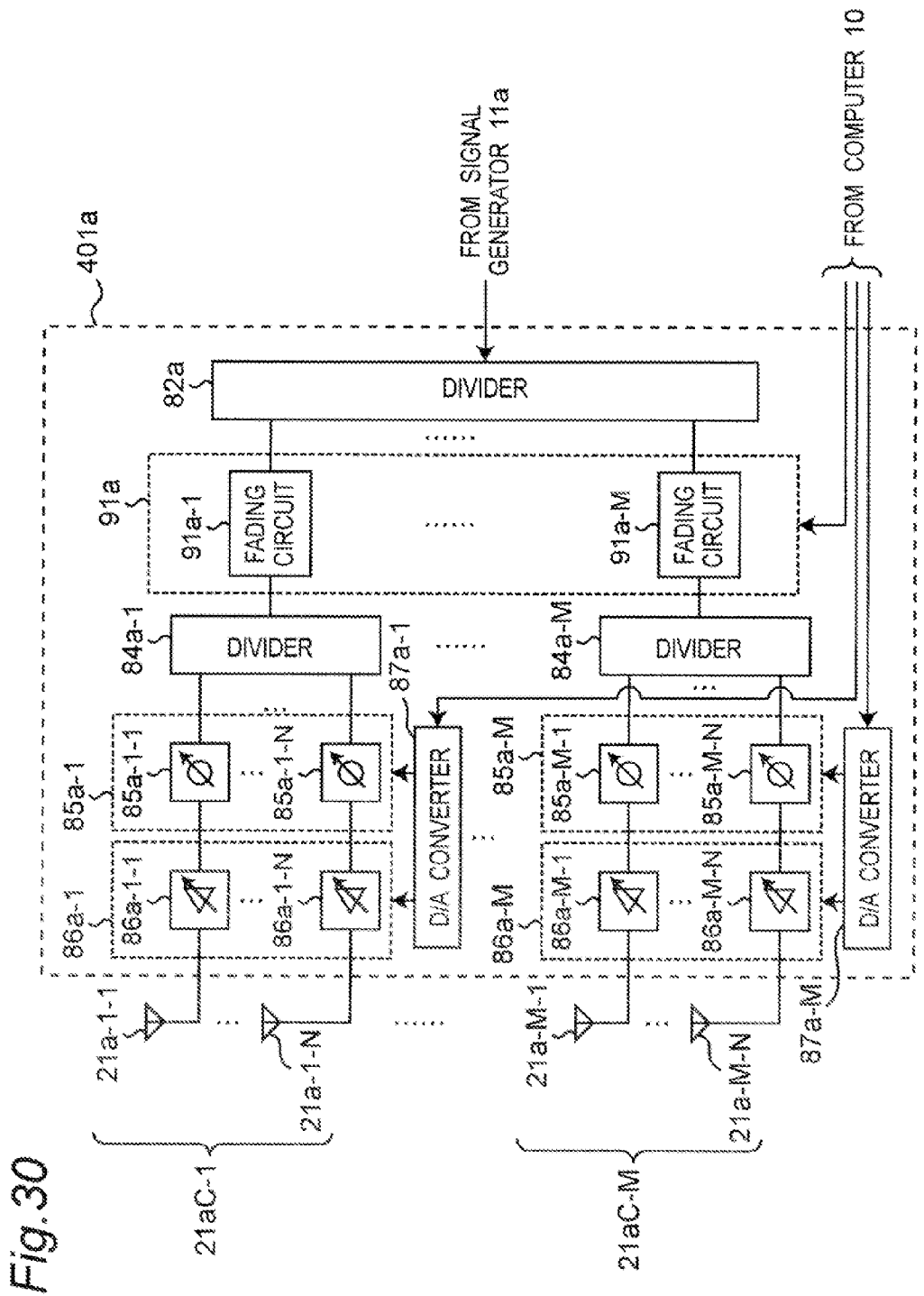
FIG. 30 is a block diagram showing a detailed configuration of a signal processing circuit 401a of an antenna evaluation apparatus according to a fourth modified embodiment of the second embodiment of the present invention.

FIG. 30 is a block diagram showing a detailed configuration of a signal processing circuit 401$a$ of an antenna evaluation apparatus according to a fourth modified embodiment of the second embodiment of the present invention. The signal processing circuit 401$a$ of the present modified embodiment is characterized by having the same configuration as that of FIG. 27, and further, being provided with fading circuits 91$a$-1 to 91$a$-M (collectively indicated by reference numeral "91$a$") similar to the fading circuit 91-1 of FIG. 14, instead of the delay circuit 83$a$ of FIG. 27. A signal processing circuit 401$b$ is also configured in the same manner as that of the signal processing circuit 401$a$ of FIG. 30. As the arrangement of antennas, either one of the arrangements shown in FIGS. 28 and 29 can be used. Thus, the antenna evaluation apparatus of the present modified embodiment has a configuration in which the third embodiment is combined with the concept of the "clusters" described in the second embodiment. Therefore, according to the antenna evaluation apparatus of the present modified embodiment, when evaluating the performance of receiving antennas of a MIMO wireless communication system, it is possible to set different angles of arrival for different clusters (spatial clusters), and generate a plurality of delayed waves for different clusters and produce different fadings (preferably, fadings having no correlation with each other) for the different delayed waves, under an assumption that incoming waves for different clusters travel different propagation paths.

Figure 31:
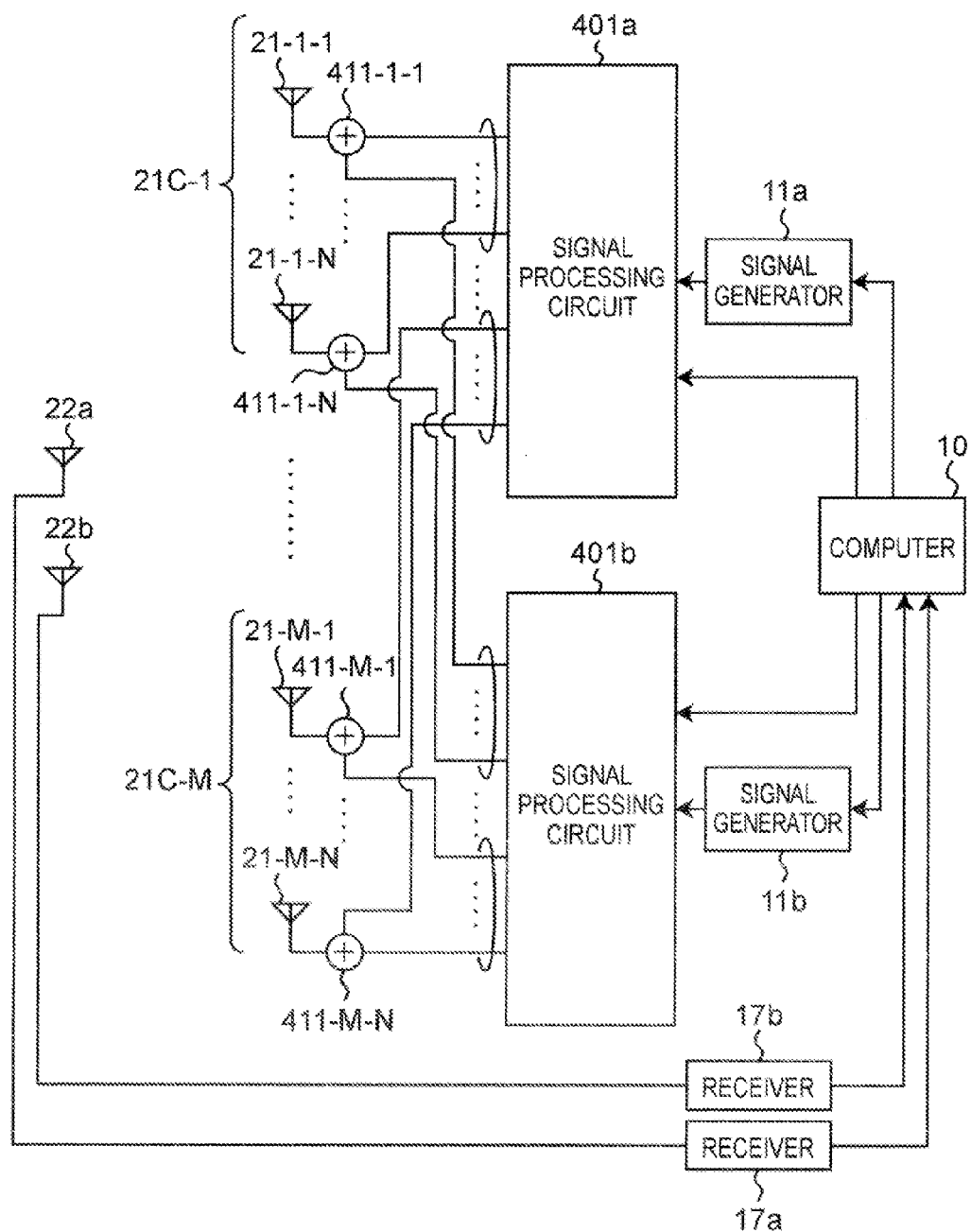
FIG. 31 is a block diagram showing a configuration of an antenna evaluation apparatus according to a fifth modified embodiment of the second embodiment of the present invention.

FIG. 31 is a block diagram showing a configuration of an antenna evaluation apparatus according to a fifth modified embodiment of the second embodiment of the present invention. If different clusters, each radiating radio frequency signals corresponding to a radio frequency signal generated by one of different signal generators, overlap each other as shown in FIG. 29, common scatterer antennas may be used instead of providing separate scatterer antennas for a radio frequency signal generated by a signal generator 11$a$ and a radio frequency signal generated by a signal generator 11$b$. The antenna evaluation apparatus of the present modified embodiment has the same configuration as that of shown in FIG. 26, and is further provided with the combiners 411-1-1 to 411-1-N, ..., 411-M-1 to 411-M-N. These combiners are respectively connected to scatterer antennas 21-1-1 to 21-1-N, ..., 21-M-1 to 21-M-N arranged in the same manner as in FIG. 12. The combiner 411-1-1 combines radio frequency signals, which are radiated from scatterer antennas 21$a$-1-1 and 21$b$-1-1 in the case of the antenna evaluation apparatus of FIG. 26, and the combined radio frequency signal is radiated from the scatterer antenna 21-1-1. The other combiners also combine radio frequency signals in the same manner, and the combined radio frequency signals are radiated from the corresponding scatterer antennas. Signal processing circuits 401$a$ and 401$b$ can use either one of the configurations shown in FIGS. 27 and 30. Further, it is not necessary that all the scatterer antennas radiate combined radio frequency signals including radio frequency signals each corresponding to radio frequency signals generated by one of different signal generators, and at least only some of the scatterer antennas may radiate the combined radio frequency signals. Thus, the antenna evaluation apparatus of the present modified embodiment can achieve a variety of distributions of radiated multipath waves in a more flexible manner, and reduce the number of scatterer antennas as compared to the configuration of FIG. 26, thus simplifying the configuration of the antenna evaluation apparatus and reducing costs.

Although FIGS. 26 to 31 show the case in which all the sets of scatterer antennas include the same number (N) of scatterer antennas, the antenna evaluation apparatus may be configured such that different sets of scatterer antennas include different numbers of scatterer antennas.

As further modified embodiment of the antenna evaluation apparatuses according to the embodiments of the present invention described above, three or more signal generators and three or more receivers may be used for generating three or more radio frequency signals having no correlation with each other, instead of generating two radio frequency signals having no correlation with each other, and thus for creating a multipath propagation environment. In this case, it is possible to evaluate the performance of receiving antennas of a MIMO wireless communication system using a larger number of transmitting antennas and receiving antennas. Further, radio frequency signals generated by the plurality of signal generators are not limited to have no correlation with each other, and other appropriate radio frequency signals can be used as long as the signals can be distinguished from each other.

According to the antenna evaluation apparatus according to the first embodiment of the present invention described above, when evaluating the performance of receiving antennas of a MIMO wireless communication system, it is possible to provide the antenna evaluation apparatus capable of creating a multipath propagation environment including different fadings and different delays for different substreams transmitted from a MIMO transmitter, under an assumption that the substreams travel different propagation paths.

Further, according to the antenna evaluation apparatus and the antenna evaluation method according to the second embodiment of the present invention, when evaluating the performance of receiving antennas of a MIMO wireless communication system, it is possible to create a multipath propagation environment having different angle of arrival for different clusters (spatial clusters) and different delay times for different clusters (temporal clusters), under an assumption that incoming waves for different clusters travel different propagation paths.

Furthermore, according to the antenna evaluation apparatus and the antenna evaluation method according to the third embodiment of the present invention, when evaluating the performance of receiving antennas of a MIMO wireless communication system, it is possible to produce spatial fadings, and at the same time, generate a plurality of delayed waves and produce fadings having no correlation with each other for the different delayed waves.

REFERENCE SIGNS LIST

10: COMPUTER,
11$a$ and 11$b$: SIGNAL GENERATOR, 12$a$, 12$b$, 73, 73-1 to 73-N, 83, 83-1 to 83-M, 83$a$, and 83$a$-1 to 83$a$-M: DELAY CIRCUIT,
12$aa$ and 12$ac$: FREQUENCY CONVERTER,
12$ab$: DELAY PROCESSING CIRCUIT,
13$a$, 13$b$, 52, 72, 82, 82$a$, 84-1 to 84-M, and 84$a$-1 to 84$a$-M: DIVIDER,
14$a$, 14$b$, 53, 61$a$, 61$b$, 65, 74, 85-1 to 85-M, and 85$a$-1 to 85$a$-M: PHASE-SHIFT CIRCUIT,
14$a$-1 to 14$a$-N, 14$b$-1 to 14$b$-N, 53-1 to 53-N, 61$a$-1 to 61$a$-N, 61$b$-1 to 61$b$-N, 65-1 to 65-N, 74-1 to 74-N, 85-1-1 to 85-1-N, . . . , 85-M-1 to 85-M-N, and 85$a$-1-1 to 85$a$-1-N, 85$a$-M-1 to 85$a$-M-N: PHASE SHIFTER,
15$a$, 15$b$, 42, 54, 62$a$, 62$b$, 66, 75, 86-1 to 86-M, and 86$a$-1 to 86$a$-M: ATTENUATION CIRCUIT,
15$a$-1 to 15$a$-N, 15$b$-1 to 15$b$-N, 42-1 to 42-N, 54-1 to 54-N, 62$a$-1 to 62$a$-N, 62$b$-1 to 62$b$-N, 66-1 to 66-N, 75-1 to 75-N, 86-1-1 to 86-1-N, . . . , 86-M-1 to 86-M-N, and 86$a$-1-1 to 86$a$-1-N, . . . , 86$a$-M-1 to 86$a$-M-N: ATTENUATOR,
16$a$, 16$b$, 43$a$, 43$b$, 43$c$, 55, 63$a$, 63$b$, 67, 76, 87-1 to 87-M, 87$a$-1 to 87$a$-M, and 92-1 to 92-M: D/A CONVERTER,
17$a$ and 17$b$: RECEIVER,
21$a$-1 to 21$a$-N, 21$b$-1 to 21$b$-N, 21-1 to 21-N, 21-1-1 to 21-1-N, . . . , 21-M-1 to 21-M-N, 21$a$-1-1 to 21$a$-1-N, 21$a$-M-1 to 21$a$-M-N, and 21$b$-1-1 to 21$b$-1-N, 21$b$-M-1 to 21$b$-M-N: SCATTERER ANTENNA,
21C-1 to 21C-M, 21$a$C-1 to 21$a$C-M, and 21$b$C-1 to 21$b$C-M: SET OF SCATTERER ANTENNAS,
22$a$ and 22$b$: RECEIVING ANTENNA,
31-1 to 31-N, 41-1 to 41-N, 51, 64-1 to 64-N, 71, 81, and 411-1-1 to 411-1-N, 411-M-1 to 411-M-N: COMBINER,
91, 91-1 to 91-M, 91$a$-1 to 91$a$-M, 91$a$, and 91$b$: FADING CIRCUIT,
200: MIMO TRANSMITTER,
210: MIMO RECEIVER,
301: FIFO MEMORY,
302 and 306: COMPLEX MULTIPLIER,
303: DSP,
304: GAUSSIAN NOISE GENERATOR,
305: DOPPLER SPECTRUM FILTER,
307: COMBINER,
311: AMOUNT-OF-DELAY SETTING UNIT,
312: NUMBER-OF-PATH SETTING UNIT,
313: COMPLEX COEFFICIENT SETTING UNIT,
321 and 322: FREQUENCY CONVERTER,
401$a$ and 401$b$: SIGNAL PROCESSING CIRCUIT,
B1, B2, B3, and B4: OBSTACLE,
C-1, C-2, . . . , C-M, Ca-1, Ca-2, . . . , Ca-M, and Cb-1, Cb-2, . . . , Cb-M: CLUSTER OF INCOMING WAVES.

The invention claimed is:

1. A multi-input multi-output (MIMO) antenna evaluation apparatus comprising a receiving antenna to be evaluated and a plurality of scatterer antennas surrounding the receiving antenna, the MIMO antenna evaluation apparatus comprising:

a plurality of signal generators each generating a radio frequency signal corresponding to one of substreams transmitted using a MIMO communication scheme;

delay circuits for respectively adding delay times independent from each other to the respective generated radio frequency signals, and outputting resulting radio frequency signals;

a divider for dividing each of the radio frequency signals outputted from the delay circuits;

a first radio frequency circuit for adjusting phases and amplitudes of the respective divided radio frequency signals; and a controller for controlling the delay circuits to add the delay times to the respective generated radio frequency signals, and controlling the first radio frequency circuit to change the phases and amplitudes of the respective divided radio frequency signals to produce a first fading, the first fading including a Doppler shift due to a virtual movement of the receiving antenna, wherein, with respect to each of the radio frequency signals generated by the signal generators, the MIMO antenna evaluation apparatus radiates the radio frequency signals whose phases and amplitudes are adjusted by the first radio frequency circuit, from the scatterer antennas, thereby creating multipath waves including delay and the first fading around the receiving antenna.

2. The MIMO antenna evaluation apparatus as claimed in claim 1, wherein each of the delay circuits further
produces at least one delayed radio frequency signal from the radio frequency signal generated by a corresponding one of the signal generators,
adds second fadings different from each other to the generated radio frequency signal and to each of the at least one delayed radio frequency signal, respectively,
combines the radio frequency signals to which the second fadings are added, with each other, and
outputs the combined radio frequency signal,
wherein the second fadings different from each other correspond to different propagation paths, respectively.

3. The MIMO antenna evaluation apparatus as claimed in claim 2, further comprising a plurality of combiners, each combining the radio frequency signals whose phases and amplitudes are adjusted by the first radio frequency circuit, so as to combine the radio frequency signals corresponding to the respective radio frequency signals generated by the different signal generators, wherein at least one of the scatterer antennas radiates the combined radio frequency signals.

4. The MIMO antenna evaluation apparatus as claimed in claim 2, wherein the first radio frequency circuit includes a plurality of phase-shift circuits and a plurality of amplitude adjusting circuits,
wherein the MIMO antenna evaluation apparatus further comprises a plurality of combiners, and each of the combiners combines the radio frequency signals which are divided by the divider and whose phases are adjusted by the respective phase-shift circuits, so as to combine the radio frequency signals corresponding to the respective radio frequency signals generated by the different signal generators, and wherein each of the amplitude adjusting circuits adjusts an amplitude of a corresponding one of the combined radio frequency signals.

5. The MIMO antenna evaluation apparatus as claimed in claim 2, further comprising a combiner for combining the radio frequency signals outputted from the delay circuits with each other, and sending the combined radio frequency signal to the divider, wherein each of the radio frequency signals divided by the divider includes the radio frequency signals corresponding to the respective radio frequency signals generated by the different signal generators.

6. The MIMO antenna evaluation apparatus as claimed in claim 2, further comprising a second radio frequency circuit being provided between the divider and the first radio frequency circuit, for adjusting the phases and amplitudes of the respective divided radio frequency signals, wherein the controller controls the second radio frequency circuit to adjust the phases and amplitudes of the radio frequency signals to set a distribution of incoming waves.

7. The MIMO antenna evaluation apparatus as claimed in claim 2, wherein the second fadings different from each other have no correlation with each other.

8. The MIMO antenna evaluation apparatus as claimed in claim 2, wherein the delay circuits include fading simulators.

9. A multi-input multi-output (MIMO) antenna evaluation apparatus comprising a receiving antenna to be evaluated and a plurality of scatterer antennas surrounding the receiving antenna, the scatterer antennas being arranged to make M sets of scatterer antennas, each set of scatterer antennas including a number of the scatterer antennas, each set of scatterer antennas being provided close together in one of a plurality of M directions toward the receiving antenna, the MIMO antenna evaluation apparatus comprising:

a plurality of signal generators each generating a radio frequency signal corresponding to one of substreams transmitted using a MIMO communication scheme;

a plurality of signal processing circuits each processing a corresponding one of the generated radio frequency signals; and a controller, wherein each of the signal processing circuits includes:

a first divider for dividing a corresponding one of the generated radio frequency signals;

a plurality of delay circuits for respectively adding delay times independent from each other to the respective radio frequency signals divided by the first divider, and outputting resulting radio frequency signals;

a plurality of second dividers each dividing a corresponding one of the radio frequency signals outputted from the respective delay circuits; and a plurality of radio frequency circuits each adjusting phases and amplitudes of the radio frequency signals divided by a corresponding one of the second dividers, wherein the controller controls the respective delay circuits to add the delay times to the respective radio frequency signal divided by the first divider, and controls each of the radio frequency circuits to change the phases and amplitudes of the radio frequency signals divided by a corresponding one of the second dividers to produce a first fading, the first fading including a Doppler shift due to a virtual movement of the receiving antenna, and wherein with respect to each of the radio frequency signals divided by the first divider, the MIMO antenna evaluation apparatus radiates the radio frequency signals whose phases and amplitudes are adjusted by a corresponding one of the radio frequency circuits, from the scatterer antennas included in a corresponding set of the sets of scatterer antennas, thereby creating clusters of incoming waves around the receiving antenna, and creating multipath waves including delay and the first fading around the receiving antenna.

10. The MIMO antenna evaluation apparatus as claimed in 9, wherein each of the delay circuits further produces at least one delayed radio frequency signal from a corresponding one of the radio frequency signals divided by the first divider, adds second fadings different from each other to the corresponding one of the divided radio frequency signals and to each of the at least one delayed radio frequency signal, respectively, combines the radio frequency signals to which the second fadings are added, with each other, and outputs the combined radio frequency signal, wherein the second fadings different from each other correspond to different propagation paths, respectively.

11. The MIMO antenna evaluation apparatus as claimed in claim 10, further comprising a plurality of combiners, each combining the radio frequency signals whose phases and amplitudes are adjusted by the radio frequency circuits, so as to combine the radio frequency signals corresponding to the respective radio frequency signals generated by the different signal generators, wherein at least one of the scatterer antennas radiates the combined radio frequency signals.

12. The MIMO antenna evaluation apparatus as claimed in claim 10, wherein the second fadings different from each other have no correlation with each other.

13. The MIMO antenna evaluation apparatus as claimed in claim 10, wherein each of the delay circuits is a fading simulator.

14. A multi-input multi-output (MIMO) evaluation method for evaluating a receiving antenna by using a MIMO antenna evaluation apparatus including the receiving antenna to be evaluated and a plurality of scatterer antennas surrounding the receiving antenna, the MIMO antenna evaluation apparatus including:

a plurality of signal generators each generating a radio frequency signal corresponding to one of substreams transmitted using a MIMO communication scheme;

delay circuits for respectively adding delay times independent from each other to the respective generated radio frequency signals, and outputting resulting radio frequency signals;

a divider for dividing each of the radio frequency signals outputted from the delay circuits; and a radio frequency circuit for adjusting phases and amplitudes of the respective divided radio frequency signals, wherein the MIMO antenna evaluation method includes the steps of:

producing a first fading including a Doppler shift due to a virtual movement of the receiving antenna; and producing second fadings different from each other corresponding to different propagation paths, respectively, wherein the step of producing the first fading includes controlling the radio frequency circuit to change the phases and amplitudes of the respective divided radio frequency signals to produce a fading, wherein the step of producing the second fadings includes controlling each of the delay circuits to:

produce at least one delayed radio frequency signal from the radio frequency signal generated by a corresponding one of the signal generators, add the second fadings to the generated radio frequency signal and to each of the at least one delayed radio frequency signal, respectively, combine the radio frequency signals to which the second fadings are added, with each other, and output the combined radio frequency signal, wherein the MIMO antenna evaluation method further includes the step of, with respect to each of the radio frequency signals generated by the signal generators, radiating the radio frequency signals whose phases and amplitudes are adjusted by the radio frequency circuit, from the scatterer antennas, thereby creating multipath waves including delay, the first fading, and the second fadings around the receiving antenna.

\* \* \* \* \*